United States Patent
Cornfeld

(10) Patent No.: US 8,236,600 B2
(45) Date of Patent: Aug. 7, 2012

(54) JOINING METHOD FOR PREPARING AN INVERTED METAMORPHIC MULTIJUNCTION SOLAR CELL

(75) Inventor: Arthur Cornfeld, Sandia Park, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 854 days.

(21) Appl. No.: 12/267,812

(22) Filed: Nov. 10, 2008

(65) Prior Publication Data

US 2010/0116327 A1    May 13, 2010

(51) Int. Cl.
    H01L 21/00    (2006.01)
(52) U.S. Cl. .......................... 438/74; 136/261
(58) Field of Classification Search ........... 136/243, 136/252–256, 261–262; 438/57, 73–74, 438/89–94
    See application file for complete search history.

(56) References Cited

U.S. PATENT DOCUMENTS

| | | | |
|---|---|---|---|
| 3,488,834 A | 1/1970 | Baird | |
| 3,964,155 A | 6/1976 | Leinkram et al. | |
| 4,001,864 A | 1/1977 | Gibbons et al. | |
| 4,255,211 A | 3/1981 | Fraas | |
| 4,278,474 A * | 7/1981 | Blakeslee et al. | 136/249 |
| 4,338,480 A | 7/1982 | Antypas et al. | |
| 4,393,576 A | 7/1983 | Dahlberg | |
| 4,612,408 A | 9/1986 | Moddel et al. | |
| 4,881,979 A | 11/1989 | Lewis | |
| 5,019,177 A | 5/1991 | Wanlass et al. | |
| 5,021,360 A | 6/1991 | Melman et al. | |
| 5,053,083 A | 10/1991 | Sinton et al. | |
| 5,217,539 A | 6/1993 | Fraas et al. | |
| 5,322,572 A | 6/1994 | Wanlass et al. | |
| 5,342,453 A | 8/1994 | Olson | |
| 5,376,185 A | 12/1994 | Wanlass | |
| 5,479,032 A | 12/1995 | Forrest et al. | |
| 5,510,272 A | 4/1996 | Morikawa et al. | |
| 5,944,913 A | 8/1999 | Hou et al. | |
| 6,165,873 A | 12/2000 | Hamada | |
| 6,180,432 B1 | 1/2001 | Freeouf | |
| 6,239,354 B1 | 5/2001 | Wanlass et al. | |

(Continued)

FOREIGN PATENT DOCUMENTS

EP    1 109 230 A2    6/2001

(Continued)

OTHER PUBLICATIONS

Tanabe, K., et al. "Direct-Bonded GaAs/InGaAs Tandem Solar Cell." Appl. Phys. Lett., vol. 89 (2006): Article 102106.*

(Continued)

*Primary Examiner* — Kiesha Bryant
*Assistant Examiner* — Mark Tornow

(57) ABSTRACT

A method of manufacturing a solar cell by providing a first semiconductor substrate and depositing a first sequence of layers of semiconductor material to form a first solar subcell, including a first bond layer disposed on the top of the first sequence of layers. A second semiconductor substrate is provided, and on the top surface of the second substrate a second sequence of layers of semiconductor material is deposited forming at least a second solar subcell. A second bond layer is disposed on the top of said second sequence of layers. The first solar subcell is mounted on top of the second solar subcell by joining the first bond layer to the second bond layer in an ultra high vacuum chamber, and the first semiconductor substrate is removed.

22 Claims, 35 Drawing Sheets

U.S. PATENT DOCUMENTS

| | | | |
|---|---|---|---|
| 6,252,287 B1 | 6/2001 | Kurtz et al. | |
| 6,281,426 B1 | 8/2001 | Olson et al. | |
| 6,300,557 B1 | 10/2001 | Wanlass et al. | |
| 6,300,558 B1 | 10/2001 | Takamoto et al. | |
| 6,340,788 B1 | 1/2002 | King et al. | |
| 6,482,672 B1 | 11/2002 | Hoffman et al. | |
| 6,660,928 B1 | 12/2003 | Patton et al. | |
| 6,690,041 B2 | 2/2004 | Armstrong et al. | |
| 6,951,819 B2 | 10/2005 | Iles et al. | |
| 7,071,407 B2 | 7/2006 | Fatemi et al. | |
| 7,166,520 B1 | 1/2007 | Henley | |
| 7,727,795 B2 | 6/2010 | Stan | |
| 7,741,146 B2 | 6/2010 | Cornfeld | |
| 7,785,989 B2 | 8/2010 | Sharps | |
| 7,842,881 B2 | 11/2010 | Comfeld | |
| 2001/0042503 A1* | 11/2001 | Lo et al. | 117/4 |
| 2002/0117675 A1 | 8/2002 | Mascarenhas | |
| 2003/0145884 A1* | 8/2003 | King et al. | 136/255 |
| 2003/0226952 A1 | 12/2003 | Clark | |
| 2004/0079408 A1 | 4/2004 | Fetzer | |
| 2004/0166681 A1* | 8/2004 | Iles et al. | 438/689 |
| 2004/0200523 A1 | 10/2004 | King et al. | |
| 2004/0206389 A1* | 10/2004 | Takamoto et al. | 136/255 |
| 2005/0161078 A1* | 7/2005 | Aiken | 136/259 |
| 2005/0211291 A1 | 9/2005 | Bianchi | |
| 2005/0274411 A1 | 12/2005 | King et al. | |
| 2006/0021565 A1 | 2/2006 | Zahler et al. | |
| 2006/0054900 A1* | 3/2006 | Takamoto et al. | 257/80 |
| 2006/0112986 A1 | 6/2006 | Atwater, Jr. et al. | |
| 2006/0144435 A1 | 7/2006 | Wanlass et al. | |
| 2006/0162768 A1 | 7/2006 | Wanlass et al. | |
| 2006/0185582 A1 | 8/2006 | Atwater, Jr. et al. | |
| 2007/0131275 A1* | 6/2007 | Kinsey et al. | 136/255 |
| 2007/0137694 A1 | 6/2007 | Foster et al. | |
| 2007/0218649 A1 | 9/2007 | Hernandez | |
| 2007/0277873 A1 | 12/2007 | Cornfeld et al. | |
| 2008/0029151 A1 | 2/2008 | McGlynn | |
| 2008/0149173 A1 | 6/2008 | Sharps | |
| 2008/0185038 A1 | 8/2008 | Sharps | |
| 2008/0245409 A1 | 10/2008 | Varghese et al. | |
| 2009/0038678 A1* | 2/2009 | Pan et al. | 136/255 |
| 2009/0038679 A1 | 2/2009 | Varghese | |
| 2009/0061557 A1* | 3/2009 | Akiyama et al. | 438/94 |
| 2009/0078308 A1 | 3/2009 | Varghese | |
| 2009/0078309 A1 | 3/2009 | Cornfeld et al. | |
| 2009/0078310 A1 | 3/2009 | Stan | |
| 2009/0078311 A1 | 3/2009 | Stan | |
| 2009/0155952 A1 | 6/2009 | Stan | |
| 2009/0188546 A1 | 7/2009 | McGlynn | |
| 2009/0223554 A1 | 9/2009 | Sharps | |
| 2009/0229658 A1 | 9/2009 | Stan | |
| 2009/0229662 A1 | 9/2009 | Stan | |
| 2009/0272430 A1 | 11/2009 | Cornfeld | |
| 2009/0272438 A1 | 11/2009 | Cornfeld | |
| 2009/0288703 A1 | 11/2009 | Stan | |
| 2009/0314348 A1 | 12/2009 | McGlynn | |
| 2010/0012174 A1 | 1/2010 | Varghese | |
| 2010/0012175 A1 | 1/2010 | Varghese | |
| 2010/0031994 A1 | 2/2010 | Varghese | |
| 2010/0047959 A1 | 2/2010 | Cornfeld | |
| 2010/0093127 A1 | 4/2010 | Sharps | |
| 2010/0122724 A1 | 5/2010 | Cornfeld | |
| 2010/0122764 A1 | 5/2010 | Newman | |
| 2010/0147366 A1 | 6/2010 | Stan | |
| 2010/0186804 A1 | 7/2010 | Cornfeld | |
| 2010/0203730 A1 | 8/2010 | Cornfeld | |
| 2010/0206365 A1 | 8/2010 | Chumney | |
| 2010/0229913 A1 | 9/2010 | Cornfeld | |
| 2010/0229926 A1 | 9/2010 | Newman | |
| 2010/0229932 A1 | 9/2010 | Cornfeld | |
| 2010/0229933 A1 | 9/2010 | Cornfeld | |
| 2010/0233838 A1 | 9/2010 | Varghese | |
| 2010/0233839 A1 | 9/2010 | Cornfeld | |
| 2010/0236615 A1 | 9/2010 | Sharps | |
| 2010/0248411 A1 | 9/2010 | Cornfeld | |
| 2010/0282288 A1 | 11/2010 | Cornfeld | |
| 2011/0030774 A1 | 2/2011 | Cornfeld | |
| 2011/0041898 A1 | 2/2011 | Cornfeld | |

FOREIGN PATENT DOCUMENTS

| | | |
|---|---|---|
| EP | 1 863 099 A2 | 12/2007 |
| EP | 0 658 944 B1 | 4/2009 |
| FR | 2 878 076 A1 | 5/2006 |
| WO | WO 2005/015638 A1 | 2/2005 |

OTHER PUBLICATIONS

R. Venkatasubramanian, et al., "An Inverted-Growth Approach to Development of an IR-Transparent, High-Efficiency AlGaAs/GaAs Cascade Solar Cell." 22$^{nd}$ IEEE Photovoltaic Specialists Conference, Oct. 7-11, 1991, Las Vegas, NV, USA.

P.R. Sharps, et al., "Wafer bonding for use in mechanically stacked multi-bandgap cells." 26$^{th}$ IEEE Photovoltaic Specialists Conference, Conference Record of the, Sep. 29-Oct. 3, 1997. pp. 895-898. Anaheim, CA, USA.

M. Yamaguchi, "Physics and Technologies of Superhigh-Effficiency Tandem Solar Cells." Semiconductors, vol. 33, No. 9, Sep. 1999, pp. 961-964. Toyota Technological Institute, Nagoya, Japan. © 1999, American Institute of Physics.

R.R. King, et al., "Next-Generation, High-Efficiency III-V Multijunction Solar Cells." 28$^{th}$ IEEE Photovoltaic Specialists Conference, Sep. 15-22, 2000, Anchorage, AK, USA.

S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ, USA.

R.R. King, et al., "High-Efficiency Space and Terrestrial Multijunction Solar Cells Through Bandgap Control in Cell Structures." 2002 Photovoltaic Specialists Conference, Conference Record of the 29$^{th}$ IEEE, May 19-24, 2002, pp. 776-781. New Orleans, LA, USA.

J.M. Zahler, et al., "Wafer Bonding and layer transfer processes for 4-junction high efficiency solar cells." 2002 Photovoltaic Specialists Conference, Conference Record of the 29$^{th}$ IEEE, May 19-24, 2002, pp. 1039-1042. New Orleans, LA, USA.

M.W. Wanlass et al., "Lattice-Mismatched Approaches for High-Performance, III-V Photovoltaic Energy Converters." Proceedings of the 31$^{st}$ IEEE PVSC, Jan. 3-7, 2005, Lake Buena Vista, FL, USA.

Takamoto, T., et al., "InGaP/GaAs-based Multijunction Solar Cells." Progress in Photovoltaics: Research and Applications, 2005; vol. 13, pp. 495-511. Wiley InterScience, John Wiley & Sons, Ltd., Hoboken, NJ.

M.W. Wanlass et al., "Monolithic, Ultra-Thin GaInP/GaAs/GaInAs Tandem Solar Cells." 2006 IEEE 4$^{th}$ World Conference on Photovoltaic Energy Conversion, May 7-12, 2006, Waikoloa, Hawaii, USA.

D.J. Friedman, et al., "0.7-eV GaInAs Junction for a GaInP/GaAs/GaInAs(1eV)/GaInAs(0.7eV) Four-Junction Solar Cell." 2006 IEEE 4$^{th}$ World Conference on Photovoltaic Energy Conversion, May 7-12, 2006, Waikoloa, Hawaii, USA.

J.F. Geisz, et al., "High-efficiency GaInP/GaAs/InGaAs triple-junction solar cells grown inverted with a metamorphic bottom junction." Applied Physics Letters 91, 023502 (2007), pp. 023502-1-023502-3. Online publication Jul. 10, 2007. American Institute of Physics, Melville, NY, USA.

P. Sharps, et al., "Inverting the triple junction improves efficiency and flexibility." Compound Semiconductor. Oct. 2007, pp. 25-28. IOP Publishing, Ltd., Bristol, England.

H. Yoon, et al., "Progress of Inverted Metamorphic III-V Solar Cell Development at Spectrolab." 33$^{rd}$ IEEE Photovoltaic Specialists Conference, May 11-16, 2008, San Diego, CA, USA.

J.F. Geisz, et al., "Inverted GaInP / (In)GaAs / InGaAs Triple-Junction Solar Cells with Low-Stress Metamorphic Bottom Junctions." 33$^{rd}$ IEEE Photovoltaic Specialists Conference, May 11-16, 2008, San Diego, CA, USA.

A. Cornfeld, et al., "Development of a Large Area Inverted Metamorphic Multi-junction (IMM) Highly Efficient AM0 Solar Cell." 33$^{rd}$ IEEE Photovoltaic Specialists Conference, May 11-16, 2008, San Diego, CA, USA.

A. Cornfeld, et al., "Development of a Large Area Inverted Metamorphic Multi-junction Highly Efficient AM0 Solar Cell." Conference paper presented at the 33$^{rd}$ IEEE Photovoltaic Specialists Conference (May 11-16, 2008) on May 12, 2008. San Diego, CA, USA. 17 pages.

M. Stan, et al., "Very High Efficiency Triple Junction Solar Cells by MOVPE." 14$^{th}$ International Conference of Metalorganic Vapor Phase Epitaxy. Jun. 1-6, 2008, Metz, France.

A. Cornfeld, et al., "Advances in the Performance of Inverted Metamorphic Multi-junction Solar Cells." 23$^{rd}$ European Photovoltaic Energy Conference, Sep. 1-5, 2008, Valencia, Spain.

"Partial European Search Report," Application No. EP 08 01 3466. Feb. 12, 2009. European Patent Office, Berlin, Germany.

Tanabe, K., et al., "Lattice-Mismatched Monolithic GaAs/InGaAs Two-Junction Solar Cells by Direct Wafer Bonding." Photovoltaic Energy Conversion, Conference Record of the 2006 IEEE 4th World Conference on. Waikoloa, HI. May 2006. vol. 1, pp. 768-771.

Akatsu, T., et al., "GaAs wafer bonding by atomic hydrogen surface cleaning." Journal of Applied Physics, vol. 86, No. 12, Dec. 15, 1999. pp. 7146-7150. AIP: Melville, NY.

Fontcuberta I Morral, A., "InGaAs/InP double heterostructures on InP/Si templates fabricated by wafer bonding and hydrogen-induced exfoliation." Applied Physics Letters, vol. 83, No. 26, Dec. 29, 2003. pp. 5413-5415. AIP: Melville, NY.

U.S. Appl. No. 12/265,113, filed Nov. 5, 2008, Varghese.
U.S. Appl. No. 12/708,361, Feb. 18, 2010, Cornfeld.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/775,946, filed May 7, 2010, Newman.
U.S. Appl. No. 12/813,408, filed Jun. 10, 2010, Patel.
U.S. Appl. No. 12/844,673, filed Jul. 27, 2010, Stan.

Office Action mailed Jan. 4, 2011. U.S. Appl. No. 11/445,793. (Sexl reference, double patenting rejection).

Sexl, M., et al., "MBE Growth of Metamorphic In(Ga)AlAs Buffers." 1997 IEEE International Symposium on Compound Semiconductors. Sep. 1997, pp. 49-52. IEEE, Piscataway, NJ.

Advisory Action mailed Mar. 15, 2011. U.S. Appl. No. 11/445,793.

Stan, M., et al., "High-efficiency quadruple junction solar cells using OMVPE with inverted metamorphic device structures." Journal of Crystal Growth 312 (2010), pp. 1370-1374. Elsevier, Amsterdam, Netherlands.

Venkatasubramanian, R., et al., "High-quality eutectic-metal-bonded AlGaAs-GaAs thin films on Si substrates." Applied Physics Letters, vol. 60, No. 7, pp. 886-888. Feb. 17, 1992. American Institute of Physics, Melville, NY.

Takamoto, T., et al., "Future Development of InGaP/(In)GaAs Based Multijunction Solar Cells." Proceedings of the 31$^{st}$ IEEE PVSC, Jan. 3-7, 2005, pp. 519-524. Lake Buena Vista, FL.

Wurfel, P., ed. Physics of Solar Cells: from Basic Principles to Advanced Concepts. 2$^{nd}$, Updated and Expanded Edition. 2009. Sections 6.4, 6.5 and 6.8. 20 pages. Wiley-VCH, Weinheim, Germany.

* cited by examiner

| | | |
|---|---|---|
| | n+ In$_{0.30}$GaAs | bond layer | 125 |
| | n++ In$_{0.30}$GaAs | n++ tunnel diode | 124 |
| | p++ In$_{0.30}$GaAs | p++ tunnel diode | 123 |
| | p+ InGaAlAs | BSF | 121 |
| cell C | p GaInAs | p base+ | 120 |
| | n+ GaInP | n+ emitter | 119 |
| | n+ GaInP | window | 118 |
| | n+ GaInP | barrier layer | 117 |
| | n− InGaAlAs | metamorphic buffer layer | 116 |
| | n− GaInP | barrier layer | 115 |
| | AlGaAs p++/GaAs n++ | p++/n++ tunnel diode | 114 |
| | p+ AlGaAs | BSF | 113 |
| cell B | p GaAs | p base | 112 |
| | n+ GaInP$_2$ | n+ emitter | 111 |
| | n+ GaInP$_2$ | window | 110 |
| | AlGaAs p++/InGaP n++ | p++/n++ tunnel diode | 109 |
| | p+ AlGaInP | BSF | 108 |
| cell A | p GaInP$_2$ | p base | 107 |
| | n+ GaInP$_2$ | n+ emitter | 106 |
| | n+ AlInP$_2$ | window | 105 |
| | n++ GaAs | contact layer | 104 |
| | n+ GaInP$_2$ | etch stop layer | 103 |
| | GaAs | buffer layer | 102 |
| | GaAs | Substrate | 101 |

FIG.6D

JOINING METHOD FOR PREPARING AN INVERTED METAMORPHIC MULTIJUNCTION SOLAR CELL

GOVERNMENT RIGHTS STATEMENT

This invention was made with government support under Contract No. FA9453-06-C-0345 awarded by the U.S. Air Force. The Government has certain rights in the invention.

REFERENCE TO RELATED APPLICATIONS

This application is related to co-pending U.S. patent application Ser. No. 12/258,190 filed Oct. 24, 2008.

This application is related to co-pending U.S. patent application Ser. No. 12/253,051 filed Oct. 16, 2008.

This application is related to co-pending U.S. patent application Ser. No. 12/190,449 filed Aug. 12, 2008.

This application is related to co-pending U.S. patent application Ser. No. 12/187,477 filed Aug. 7, 2008.

This application is related to co-pending U.S. patent application Ser. No. 12/218,582 filed Jul. 18, 2008.

This application is related to co-pending U.S. patent application Ser. No. 12/218,558 filed Jul. 17, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. Nos. 12/047,842, and 12/047,944, filed Mar. 13, 2008.

This application is related to co-pending U.S. patent application Ser. No. 12/023,772, filed Jan. 31, 2008.

This application is related to co-pending U.S. patent application Ser. No. 11/956,069, filed Dec. 13, 2007.

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 8, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important.

Typical III-V compound semiconductor solar cells are fabricated on a semiconductor wafer in vertical, multijunction structures. The individual solars cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties relating to the appropriate choice of materials and fabrication steps.

Prior to the present invention, the materials and fabrication steps disclosed in the prior art have not been adequate to produce a commercially viable and energy efficient solar cell using commercially established fabrication processes for producing an inverted metamorphic multijunction cell structure.

SUMMARY OF THE INVENTION

Briefly, and in general terms, the present invention provides a method of manufacturing a solar cell comprising providing a first semiconductor substrate; depositing on the first substrate a first sequence of layers of semiconductor material to form a first solar subcell, including a first bond layer disposed on the top of said first sequence of layers; providing a second semiconductor substrate; depositing on the top surface of the second substrate a second sequence of layers of semiconductor material forming at least a second solar subcell, including a second bond layer disposed on the top of said second sequence of layers; mounting the first solar subcell on top of the second solar subcell by joining the first bond layer to the second bond layer; and removing the first semiconductor substrate.

In another aspect, the present invention provides a method of manufacturing a solar cell by providing a first semiconductor substrate; depositing on a first substrate a first sequence of layers of semiconductor material forming at least one solar cell; providing a second semiconductor substrate; depositing on the second substrate a second sequence of layers of semiconductor material forming at least one solar cell; bonding the first sequence of layers to the second sequence of layers; mounting a surrogate second substrate on top to the second substrate; and removing the first substrate.

In another aspect, the present invention provides a method of manufacturing a solar cell including forming a first semiconductor structure including providing a first semiconductor substrate for the epitaxial growth of semiconductor material; forming a first subcell on said substrate comprising a first semiconductor material with a first band gap and a first lattice constant; forming a second subcell comprising a second semiconductor material with a second band gap and a second lattice constant, wherein the second band gap is less than the first band gap and the second lattice constant is greater than the first lattice constant; forming a lattice constant transition material positioned between the first subcell and the second subcell, said lattice constant transition material having a lattice constant that changes gradually from the first lattice constant to the second lattice constant; forming a second semiconductor structure including providing a second semiconductor substrate; depositing on the top surface of the second substrate a sequence of layers of semiconductor material forming at least a third solar subcell; mounting the first semiconductor structure to the second semiconductor structure; and removing the first semiconductor substrate.

In still another aspect, the present invention provides a multijunction solar cell comprising a first solar subcell having a first band gap; a second solar subcell disposed over the first solar subcell having a second band gap smaller than the first band gap; a graded interlayer disposed over the second subcell having a third band gap greater than the second band gap; a third solar subcell disposed over the graded interlayer having a fourth band gap smaller than the second band gap and lattice mismatched with respect to the second subcell; and a fourth solar subcell disposed over said third subcell having a fifth band gap smaller than said fourth band gap and lattice mismatched with respect to said third subcell.

BRIEF DESCRIPTION OF THE DRAWINGS

The invention will be better and more fully appreciated by reference to the following detailed description when considered in conjunction with the accompanying drawings, wherein:

FIG. 6D is a cross-sectional view of the solar cell of FIG. 6C after next process step;

DESCRIPTION OF THE PREFERRED EMBODIMENT

Figure 1:
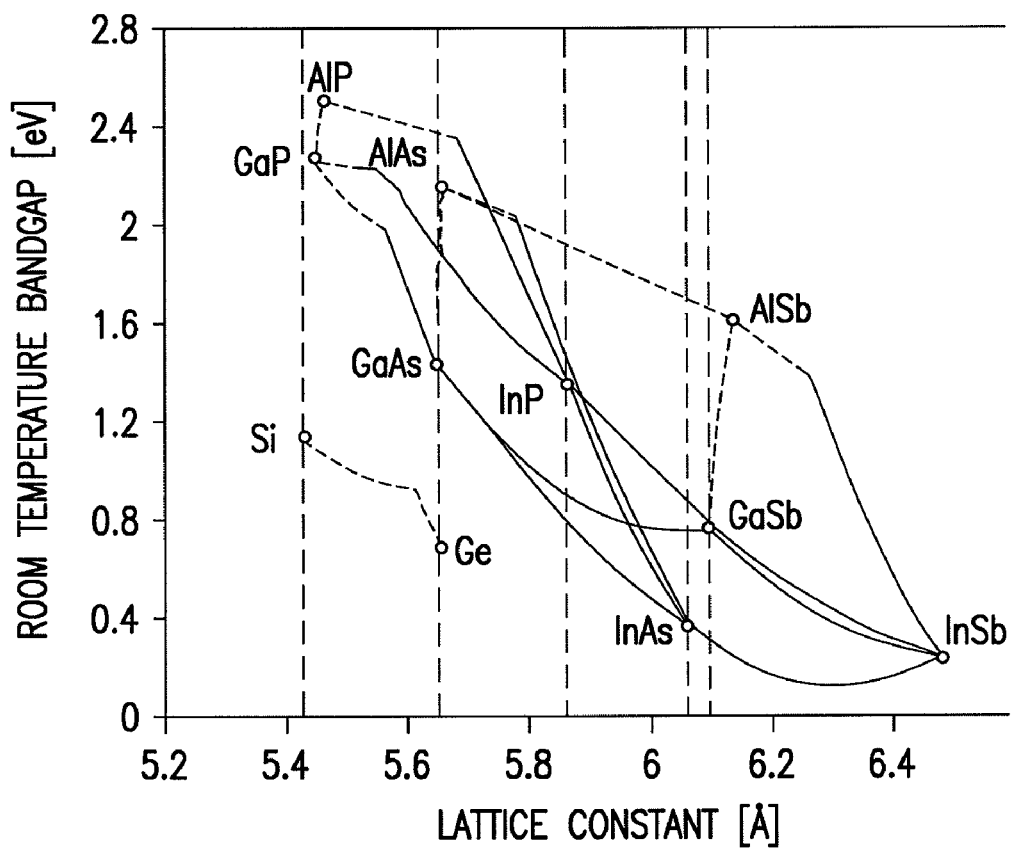
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e. a band gap in the range of 0.7 to 1.2 eV). A surrogate substrate or support structure is provided over the "bottom" or substantially lattice-mismatched lower subcell, and the growth semiconductor substrate is subsequently removed. (The growth substrate may then subsequently be re-used for the growth of a second and subsequent solar cells).

A variety of different features of inverted metamorphic multijunction solar cells are disclosed in the related applications noted above. The present invention is directed to the tandem construction or combination by a mechanical bonding process of a first semiconductor structure, including an IMM solar cell, with a second semiconductor structure, including one or more additional subcells, wherein the subcell in the second structure that is most closely adjacent to the first structure has a similar lattice constant to the bonding layer of the first structure. In the present invention, the resulting construction includes four subcells, with band gaps of approximately 1.91 eV, 1.42 eV, 1.02 eV, and 0.67 eV respectively, although other band gaps (such as, e.g. 1.98 eV for the top cell) are also contemplated to be within the scope of the design according to the present invention.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
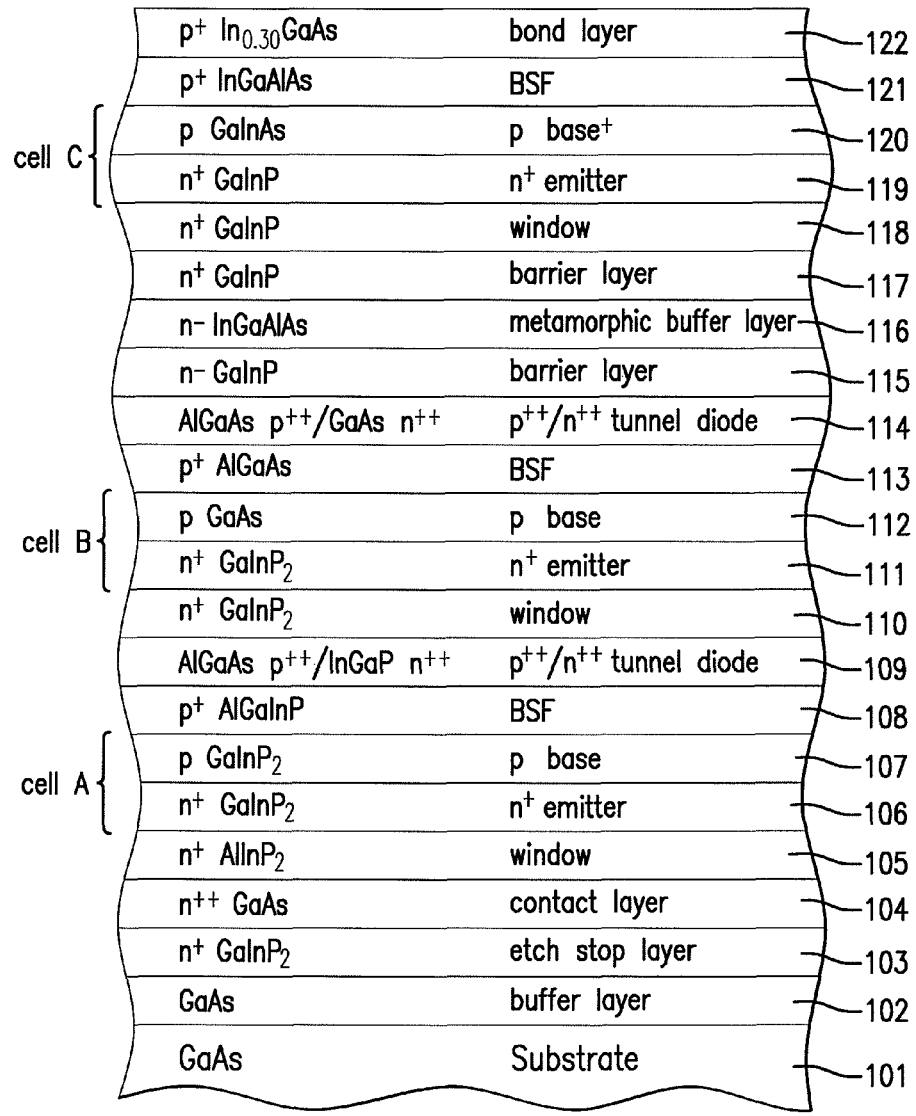
FIG. 2 is a cross-sectional view of the solar cell of the invention after the deposition of semiconductor layers on the first growth substrate.

FIG. 2 depicts a portion of the multijunction solar cell to be fabricated according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 23.

Subcell A will ultimately become the "top" subcell of the inverted metamorphic structure after completion of the process steps according to the present invention to be described hereinafter.

On top of the base layer 107 a back surface field ("BSF") layer 108 is deposited and used to reduce recombination loss, preferably p+ AlGaInP.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109 which forms a tunnel diode which is an ohmic circuit element to connect subcell A to subcell B. These layers are preferably composed of p++ AlGaAs, and n++ InGaP.

On top of the tunnel diode layers 109 a window layer 110 is deposited, preferably n+GaInP$_2$. The window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and In$_{0.015}$GaAs respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 23.

In the preferred embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the middle subcell B nor the bottom subcell C emitters will be exposed to absorbable radiation. Substantially radiation will be absorbed in the bases of cells B and C, which have narrower band gaps then the emitters. Therefore, the advantages of using heterojunction subcells are: (i) the short wavelength response for both subcells will improve, and (ii) the bulk of the radiation is more effectively absorbed and collected in the narrower band gap base. The effect will be to increase $J_{sc}$.

On top of the cell B is deposited a BSF layer 113 which performs the same function as the BSF layer 109. A p++/n++ tunnel diode 114 is deposited over the BSF layer 113 similar to the layers 109, again forming an ohmic circuit element to connect subcell B to subcell C. These layers 114 are preferably compound of p++ AlGaAs and n++ InGaP.

A barrier layer 115, preferably composed of n-type InGa (Al)P, is deposited over the tunnel diode 114, to a thickness of about 1.0 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The bandgap of layer 116 is constant throughout its thickness preferably approximately 1.5 eV or otherwise consistent with a value slightly greater than the bandgap of the middle subcell B. The preferred embodiment of the graded interlayer may also be expressed as being composed of (In$_x$Ga$_{1-x}$)$_y$Al$_{1-y}$As, with x and y selected such that the band gap of the interlayer remains constant at approximately 1.50 eV.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P of InGaP, or as in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In the preferred embodiment of the present invention, the layer 116 is composed of a plurality of layers of InGaAlAs, with monotonically changing lattice constant, each layer having the same bandgap, approximately 1.5 eV.

The advantage of utilizing a constant bandgap material such as InGaAlAs is that arsenide-based semiconductor material is much easier to process in standard commercial MOCVD reactors, while the small amount of aluminum assures radiation transparency of the metamorphic layers.

Although the preferred embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a further embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n type InGaAs and p type InGaAs respectively, or n type InGaP and p type InGaAs for a heterojunction subcell, although another suitable materials consistent with lattice constant and bandgap requirements may be used as well. The doping profile of layers 119 and 120 will be discussed in connection with FIG. 23.

A BSF layer 121, preferably composed of p+ InGaAlAs, is then deposited on top of the cell C, the BSF layer performing the same function as the BSF layers 108 and 113.

Finally, a bond layer 122, preferably composed of a p+ lattice matched InGaAs layer (preferably $In_{0.30}GaAs$) is deposited on the BSF layer 121.

Figure 3A:
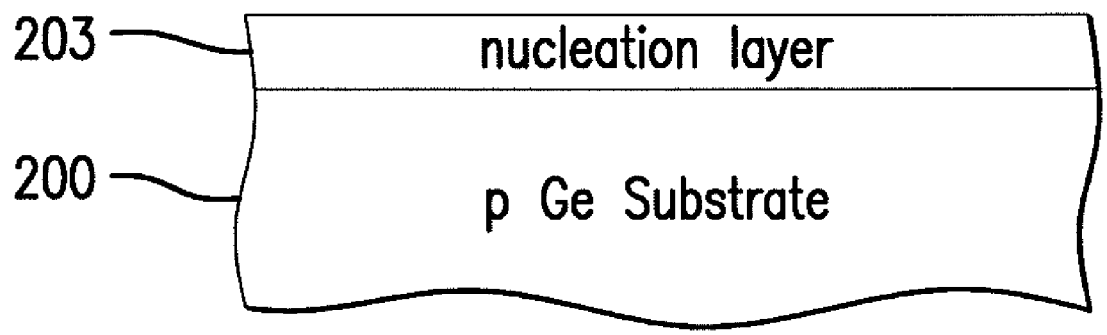
FIG. 3A is a cross-sectional view of a portion of the solar cell of the invention after the deposition of a first semiconductor layer on the second growth substrate.

FIG. 3A is a cross-sectional view of a portion of the solar cell of the invention after the deposition of a nucleation layer 203 on a second growth substrate 200 which is preferably p-type germanium.

Figure 3B:
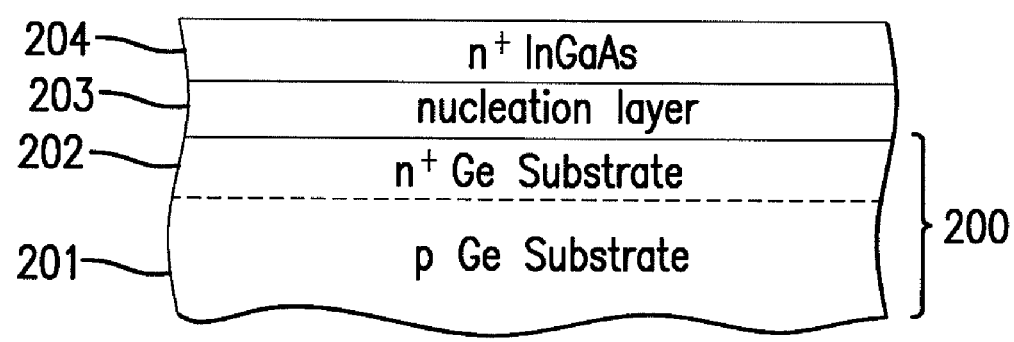
FIG. 3B is a cross-sectional view of the solar cell of FIG. 3A after the next process step.

FIG. 3B is a cross-sectional view of the substrate of FIG. 3A after the next process step in which a heavily doped n-type gallium arsenide layer, such as InGaAs, is deposited.

The emitter region 202 is formed in the Ge substrate by diffusion of dopants from one or more upper layers into the Ge substrate, thereby changing upper portion of the p-type germanium substrate 200 to an n-type region 201 which forms the emitter region of the solar cell. Typically, a heavily doped n-type gallium arsenide layer 204, such as n+ InGaAs, is deposited over the nucleation layer 203, and is a source of arsenic dopants into the emitter region 201. The remainder or lower portion of the substrate 200 remains p-type, and forms the p-type base region 201 of the solar subcell, which will be subsequently referred to as subcell D.

Figure 3C:
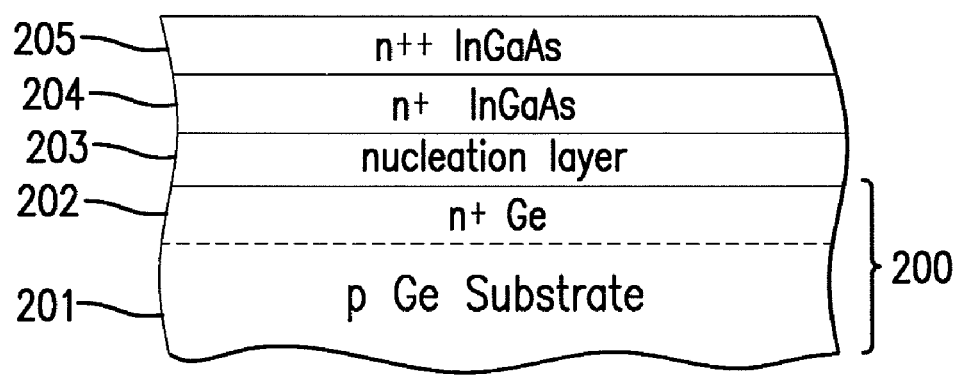
FIG. 3C is a cross-sectional view of the solar cell of FIG. 3B after next process step.

FIG. 3C is a cross-sectional view of the substrate of FIG. 3B after the next process step in which a n++ InGaAs layer 205 is deposited over layer 204. The layer 206 forms the first portion of a tunnel diode.

Figure 3D:
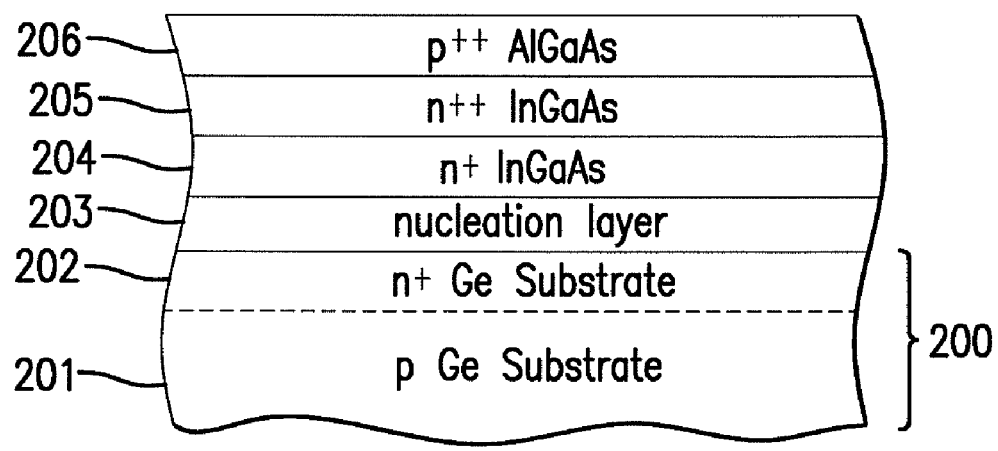
FIG. 3D is a cross-sectional view of the solar cell of FIG. 3C after next process step.

FIG. 3D is a cross-sectional view of the substrate of FIG. 3D after next process step in which a p++ AlGaAs layer 206 is deposited over layer 205. The layer 206 forms a second portion of a tunnel diode.

Figure 3E:
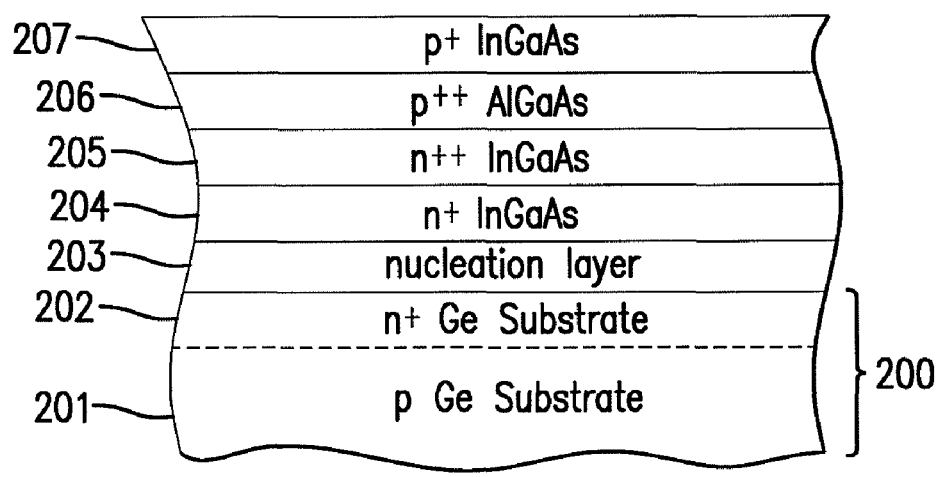
FIG. 3E is a cross-sectional view of the solar cell of FIG. 3D after next process step.

FIG. 3E is a cross-sectional view of the substrate of FIG. 3D after the next process step in which a p+ InGaAs layer 207 is deposited over layer 206. The layer 207 will subsequently serve as the bonding layer when the semiconductor structure of FIG. 3 is attached to or bonded with the semiconductor structure of FIG. 2.

Figure 4:
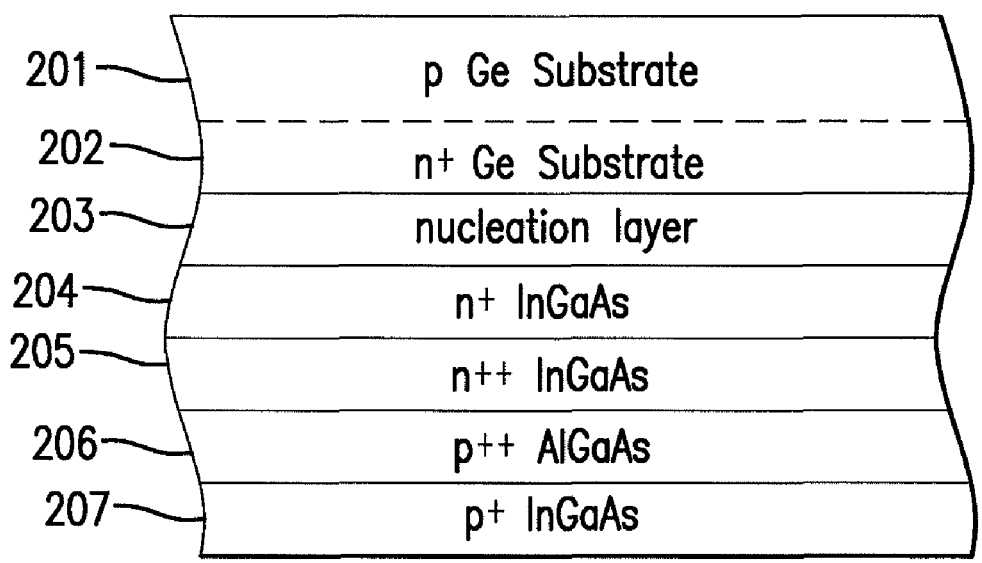
FIG. 4 is a cross-sectional view of the solar cell of FIG. 3E with an orientation depicting the second growth substrate on the top of the Figure.

FIG. 4 is a cross-sectional view of the substrate of FIG. 3E with an orientation depicting the second growth substrate on the top of the Figure. Subsequent Figures of this embodiment following in this application will assume such orientation.

It should be apparent to one skilled in the art, that additional layer(s) may be added or deleted in the cell structure of FIG. 4 without departing from the scope of the present invention.

Figure 5:
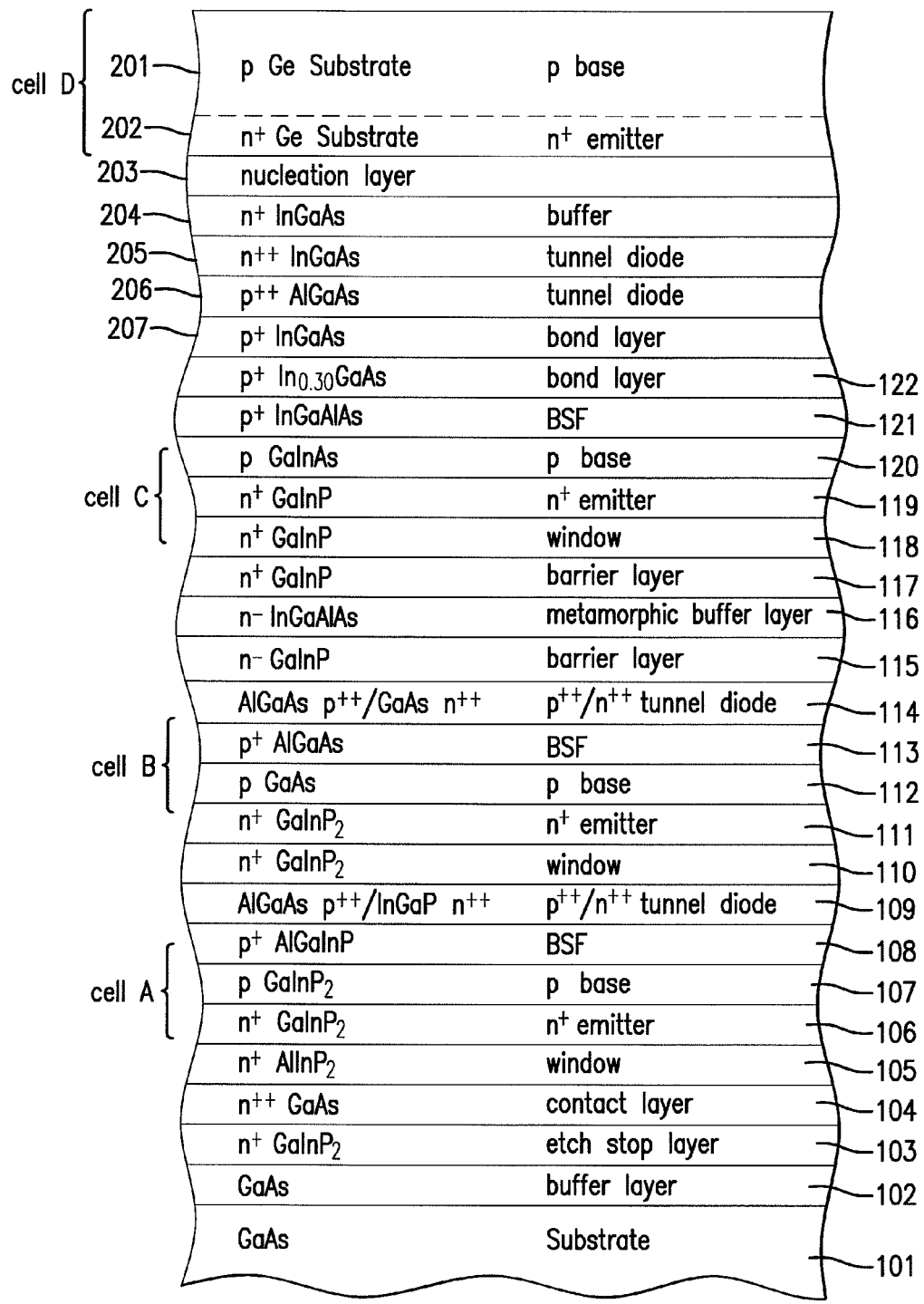
FIG. 5 is a cross-sectional view of the solar cell of a first embodiment of the present invention depicting the substrate of FIG. 2 bonded with the substrate of FIG. 4.

FIG. 5 is a cross-sectional view of the solar cell of a first embodiment of the present invention depicting the semiconductor structure of FIG. 2 bonded with the semiconductor structure of FIG. 4.

The method of bonding the wafers of the structures of FIG. 2 and FIG. 4 according to the present invention is as follows. The wafers are placed in an ultra high vacuum chamber. The wafers are then exposed to H+ ions at 400° C. to remove all oxides and carbonaceous materials on the bonding surfaces of each wafer. They are then aligned, and are mechanically brought together or compressed to form a bond at near zero pressure. Subsequent processing of the bonded structure will be described below, beginning with the description of FIG. 9.

Figure 6A:
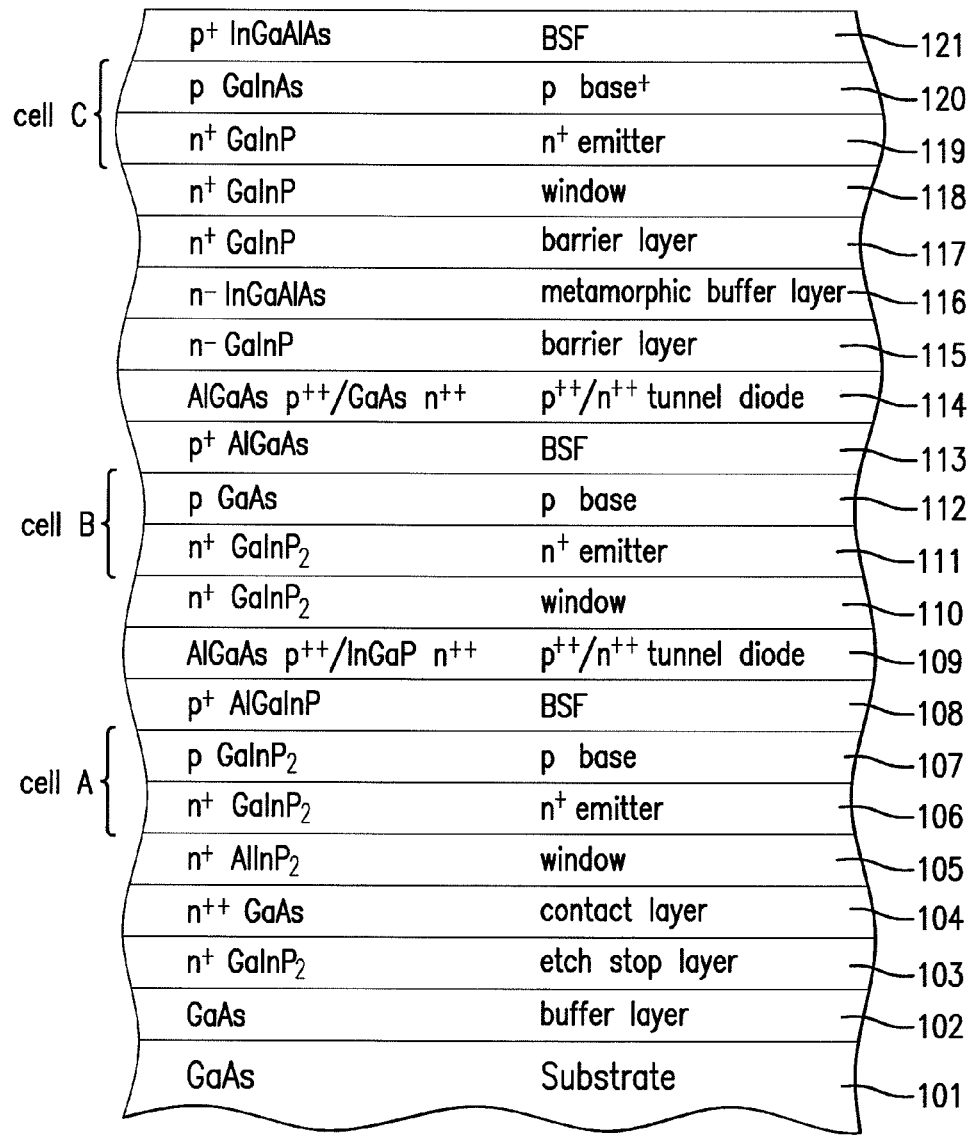
FIG. 6A is a cross-sectional view of first a portion of the solar cell in a second embodiment of the present invention after the deposition of semiconductor layers on the first growth substrate.

Turning to a second embodiment of the present invention, in which the tunnel diode is formed on the second substrate rather than the first substrate, FIG. 6A depicts a cross-sectional view of first a portion of the solar cell in a second embodiment of the present invention after the deposition of semiconductor layers on the first growth substrate up to the B SF layer 121, similar to that of the first embodiment depicted in FIG. 2.

Figure 6B:
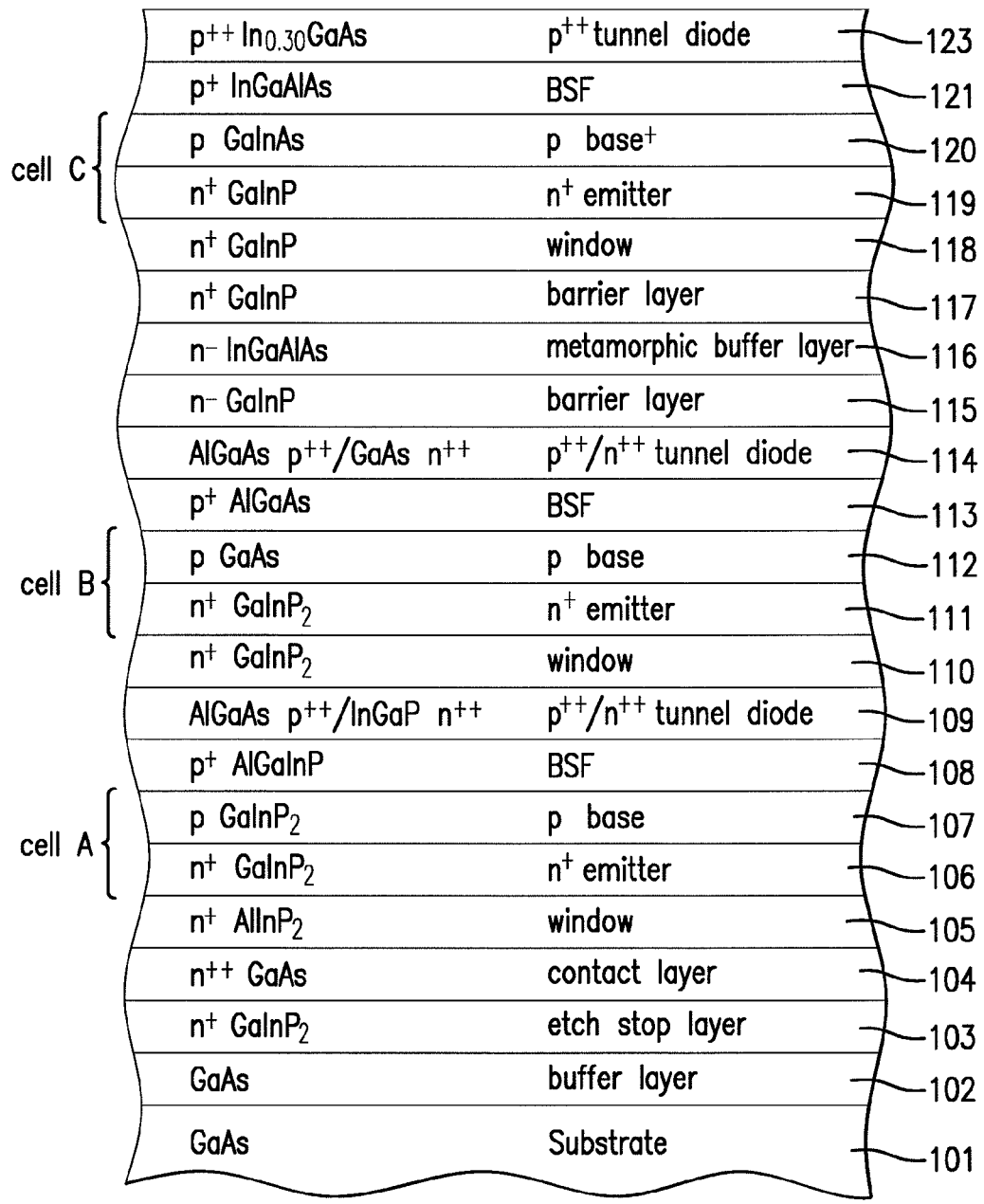
FIG. 6B is a cross-sectional view of the solar cell of FIG. 6A after the next process step.

FIG. 6B is a cross-sectional view of the structure of FIG. 6 after the next process step, in which a p++ lattice matched InGaAs tunnel diode layer 123 is deposited over BSF layer 121.

Figure 6C:
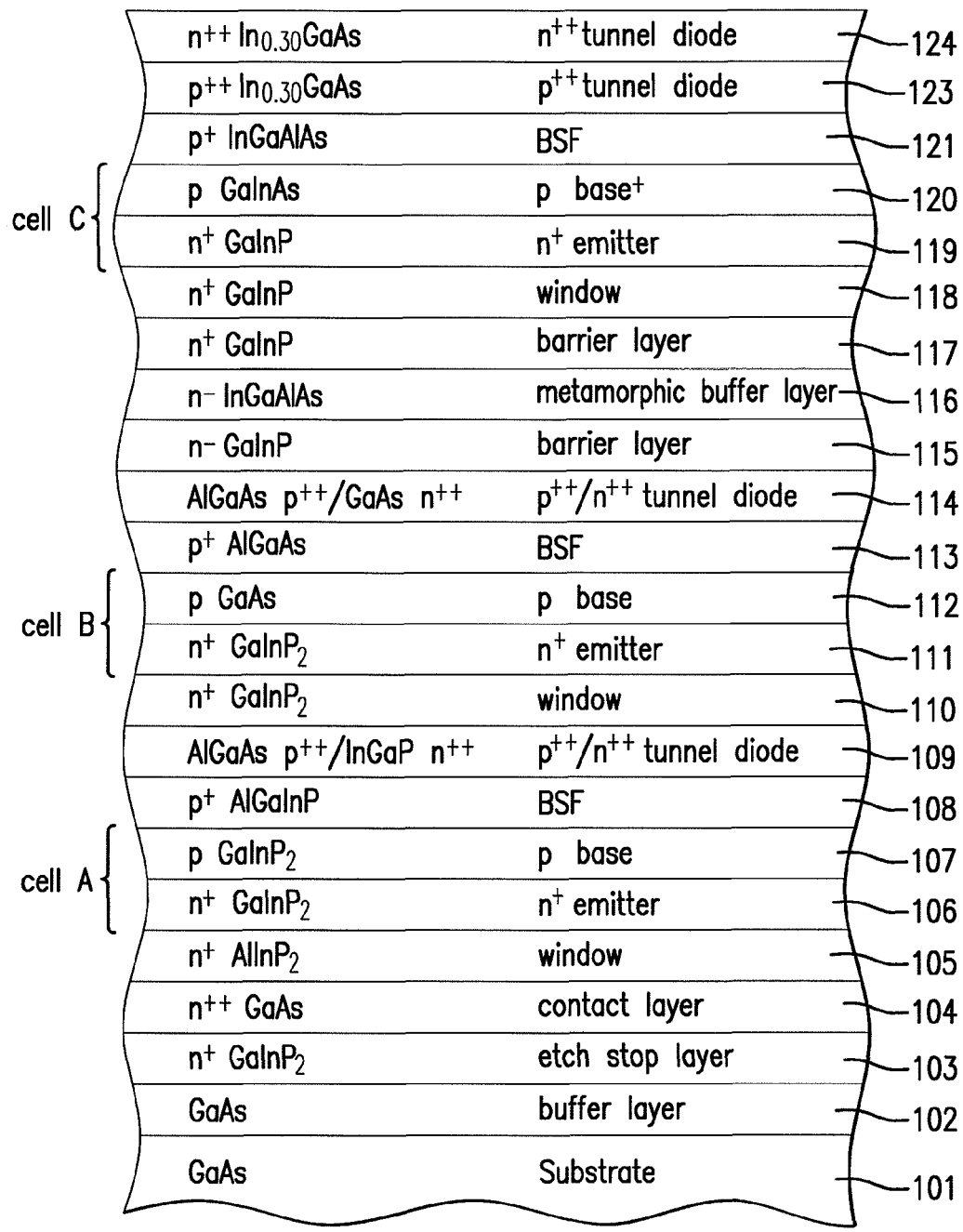
FIG. 6C is a cross-sectional view of the solar cell of FIG. 6B after next process step.

FIG. 6C is a cross-sectional view of the structure of FIG. 6B after next process step in which an n++ lattice matched InGaAs tunnel diode layer 124 is deposited over layer 123.

FIG. 6D is a cross-sectional view of the structure of FIG. 6C after the next process step in which a n+ lattice matched InGaAs bond layer 125 is deposited over layer 124.

Figure 7A:
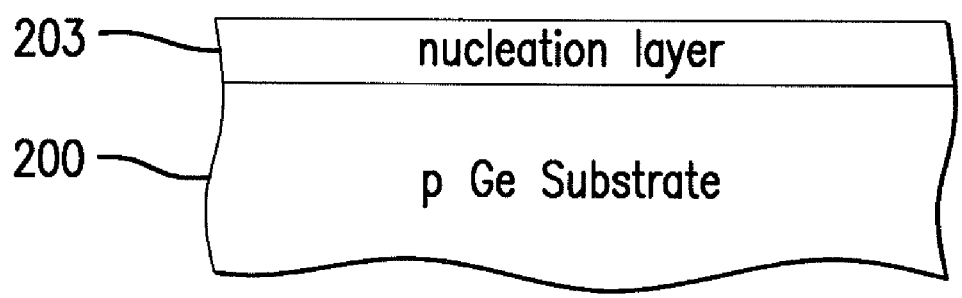
FIG. 7A is a cross-sectional view of a second portion of the solar cell in a second embodiment of the present invention after the deposition of a first semiconductor layer on the second growth substrate.

FIG. 7A is a cross-sectional view of a second portion of the solar cell in a second embodiment of the present invention after the deposition of a nucleation layer 203 on the second growth substrate 200, similar to that of the first embodiment depicted in FIG. 3A.

Figure 7B:
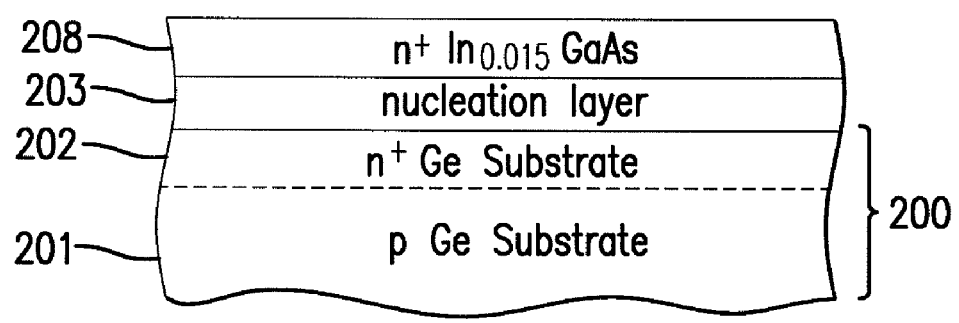
FIG. 7B is a cross-sectional view of the substrate of FIG. 7A after the next process step.

FIG. 7B is a cross-sectional view of the structure of FIG. 7A after the next process step in which a bond layer, preferably a n+ lattice matched InGaAs layer, is deposited over the nucleation layer 203.

Figure 7C:
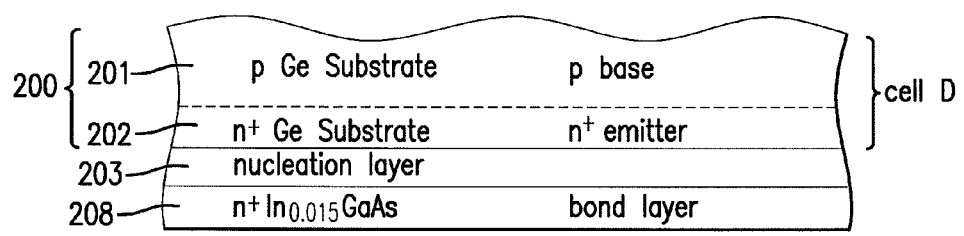
FIG. 7C is a cross-sectional view of the substrate of FIG. 7B with an orientation depicting the second growth substrate on the top of the Figure.

FIG. 7C is a cross-sectional view of the structure of FIG. 7B with an orientation depicting the second growth substrate on the top of the Figure.

Figure 8:
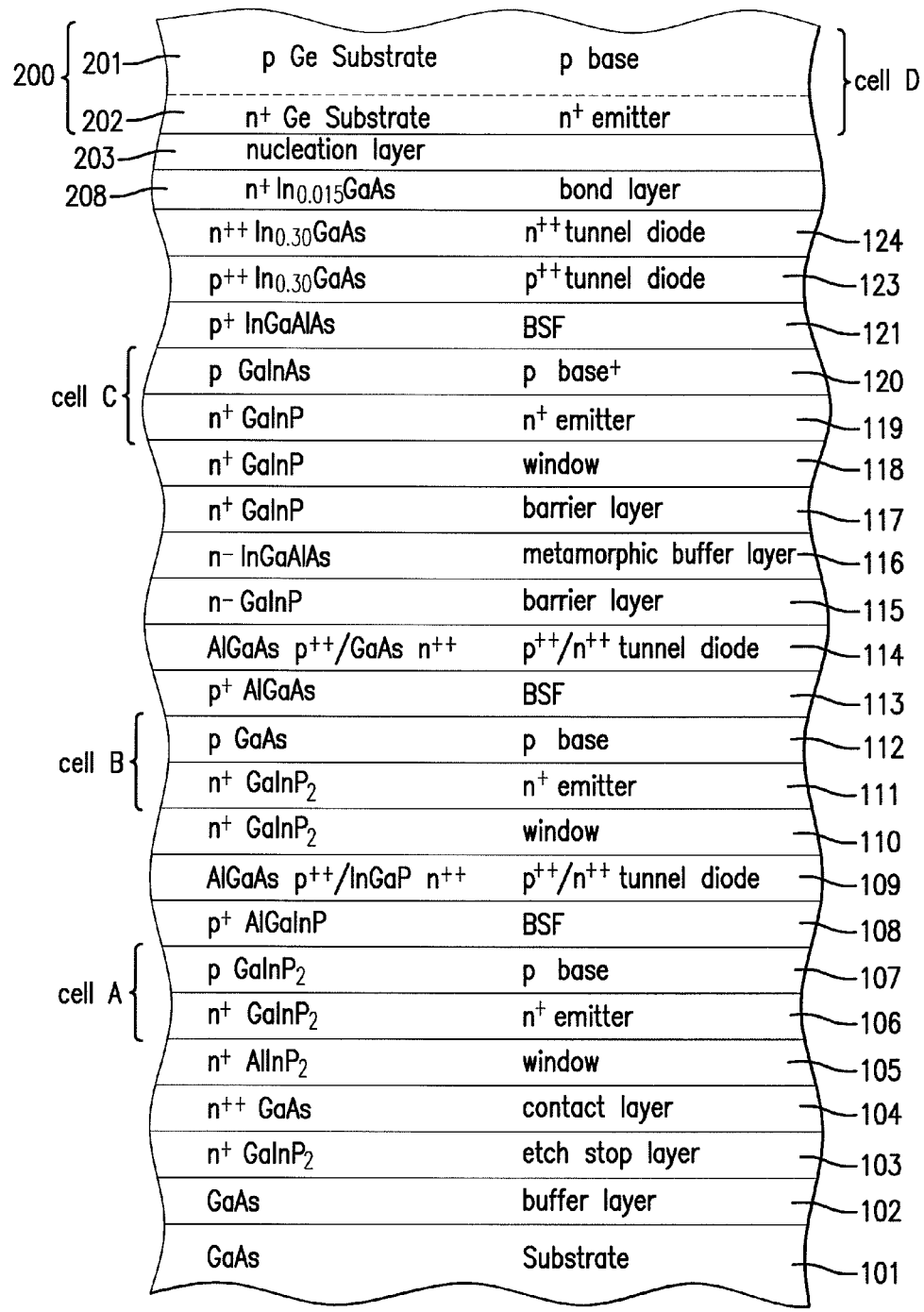
FIG. 8 is a cross-sectional view of the solar cell of the second embodiment of the present invention depicting the substrate of FIG. 6D bonded with the substrate of FIG. 7C.

FIG. 8 is a cross-sectional view of the solar cell of the second embodiment of the present invention depicting the substrate of FIG. 6 bonded with the substrate of FIG. 7C.

Figure 9:
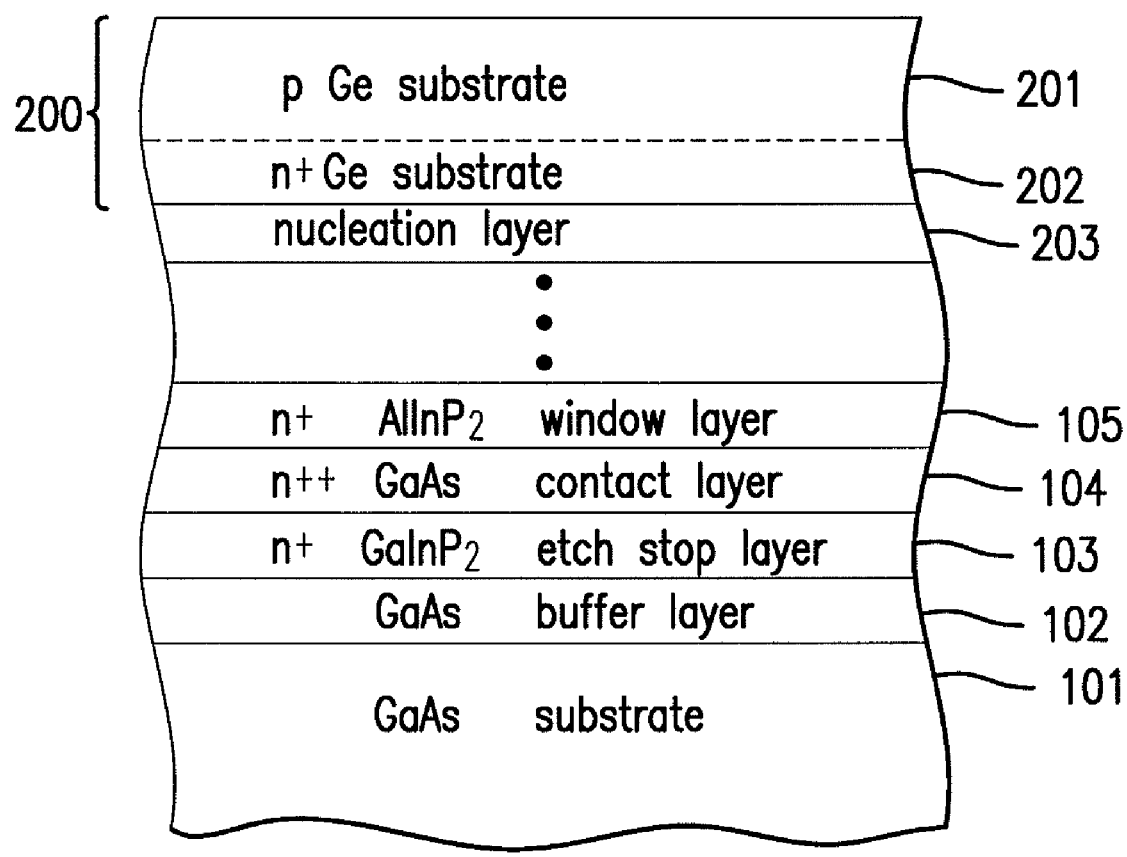
FIG. 9 is a highly simplified cross-sectional view of the solar cell of FIG. 5 or FIG. 8.

FIG. 9 is a highly simplified cross-sectional view of the solar cell semiconductor of FIG. 5 or FIG. 8 depicting just a few of the layers (201, 202, and 203) at the top of the semiconductor structure and of few of the layers (105, 104, 103, 102) at the bottom of the structure over the GaAs substrate 101.

Figure 10:
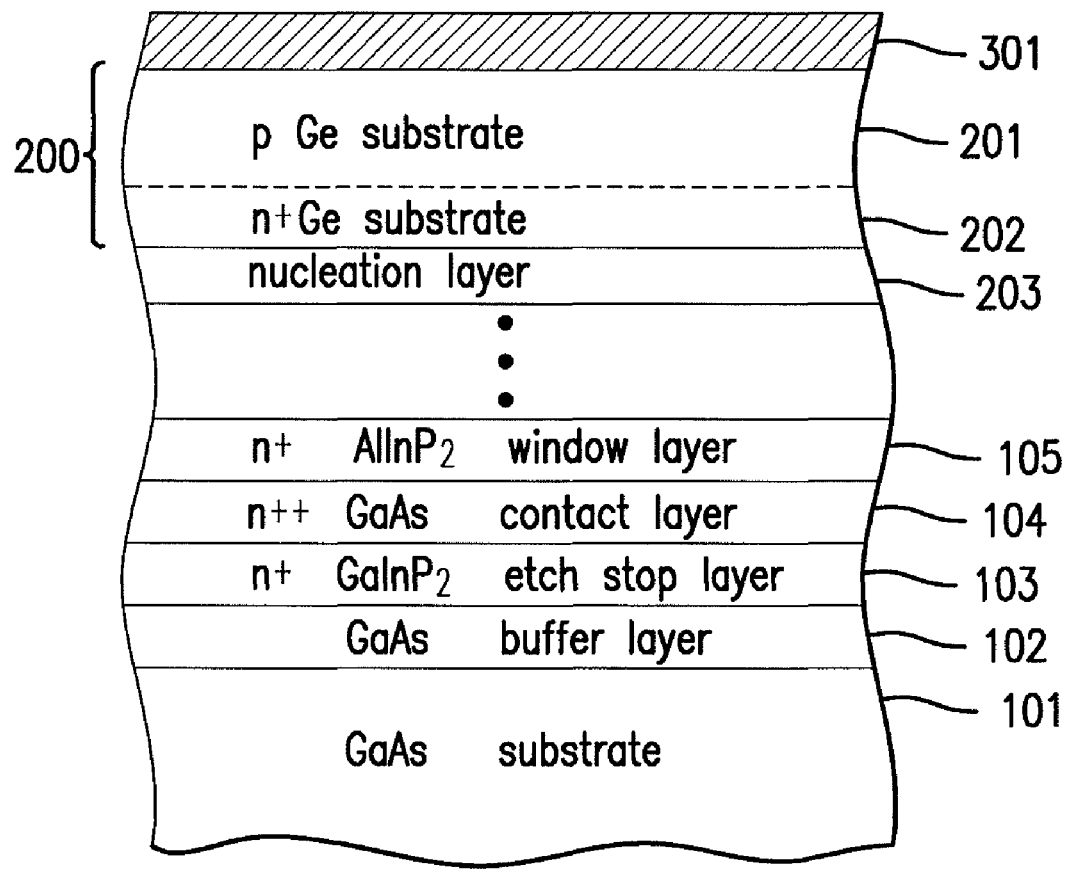
FIG. 10 is a cross-sectional view of the solar cell of FIG. 9 after the next process step in which a backside metal contact layer is deposited.

FIG. 10 is a cross-sectional view of the solar cell of FIG. 9 (i.e., a simplified version of FIG. 5 or FIG. 8) after the next process step in which a metal contact layer 301 is deposited over the exposed surface of the germanium substrate 201. The metal is preferably the sequence of metal layers Ti/Au/Ag/Au, although other metal sequences can be used as well.

Figure 11A:
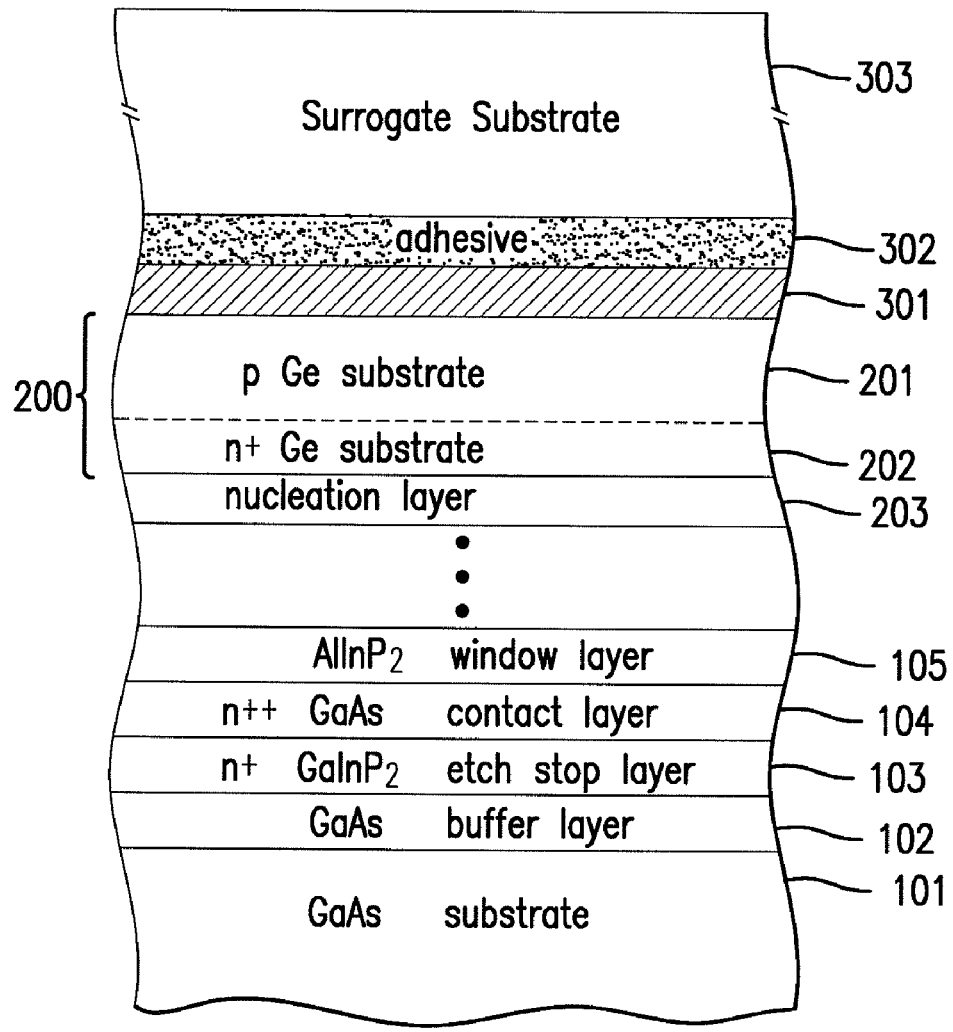
FIG. 11A is a cross-sectional view of the solar cell of FIG. 10 after next process step in which a surrogate substrate is adhered to the backside metal contact layer.

FIG. 11A is a cross-sectional view of the structure of FIG. 10 after the next process step in which an adhesive layer 302 is deposited over the metal layer 301. The adhesive is preferably Wafer Bond (manufactured by Brewer Science, Inc. of Rolla, Mo.). A surrogate substrate 303, preferably sapphire, is attached to the structure of FIG. 10 by the adhesive. Alternative, the surrogate substrate may be GaAs, Ge or Si, or other suitable material. The surrogate substrate is preferably about 40 mils in thickness, and is perforated with holes about 1 mm in diameter, spaced 4 mm apart, to aid in subsequent removal of the adhesive 302 and the substrate 303.

Figure 11B:
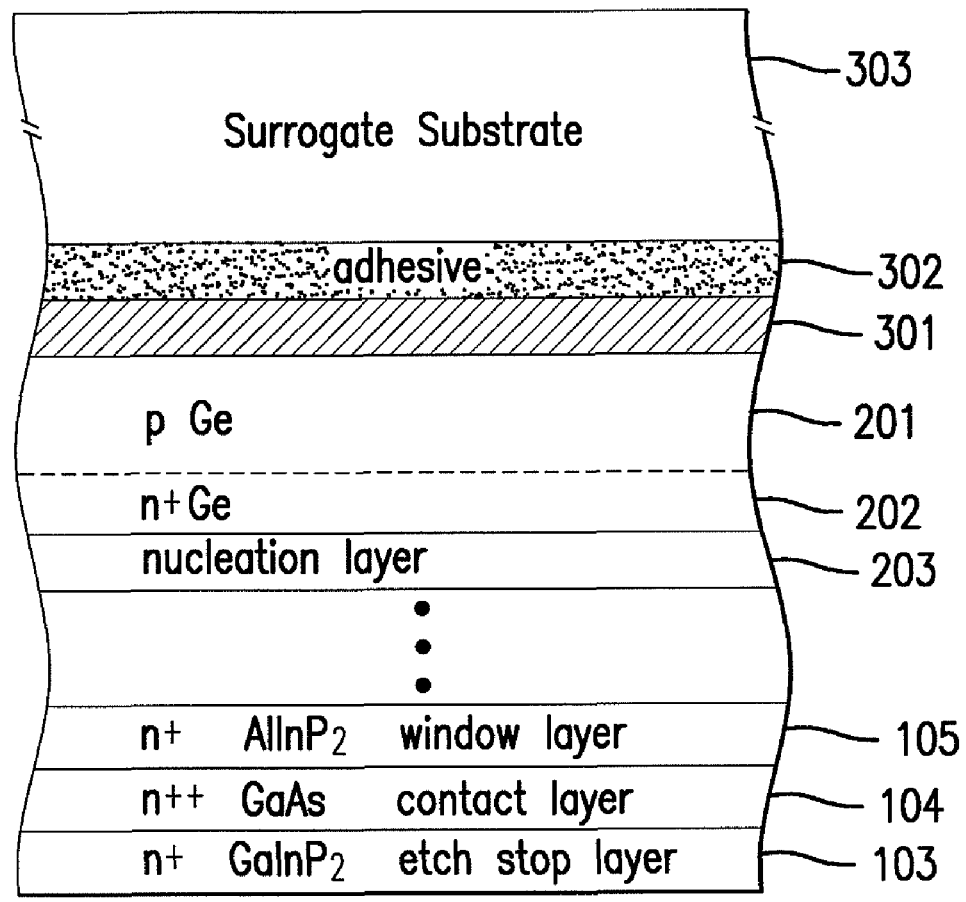
FIG. 11B is a cross-sectional view of the solar cell of FIG. 11A after the next process step in which the first growth substrate is removed.

FIG. 11B is a cross-sectional view of the solar cell of FIG. 11A after the next process step in which the GaAs substrate 101 is removed by a sequence of lapping and/or etching steps in which the substrate 101, and the buffer layer 102 are removed. The choice of a particular etchant is growth substrate dependent.

Figure 11C:
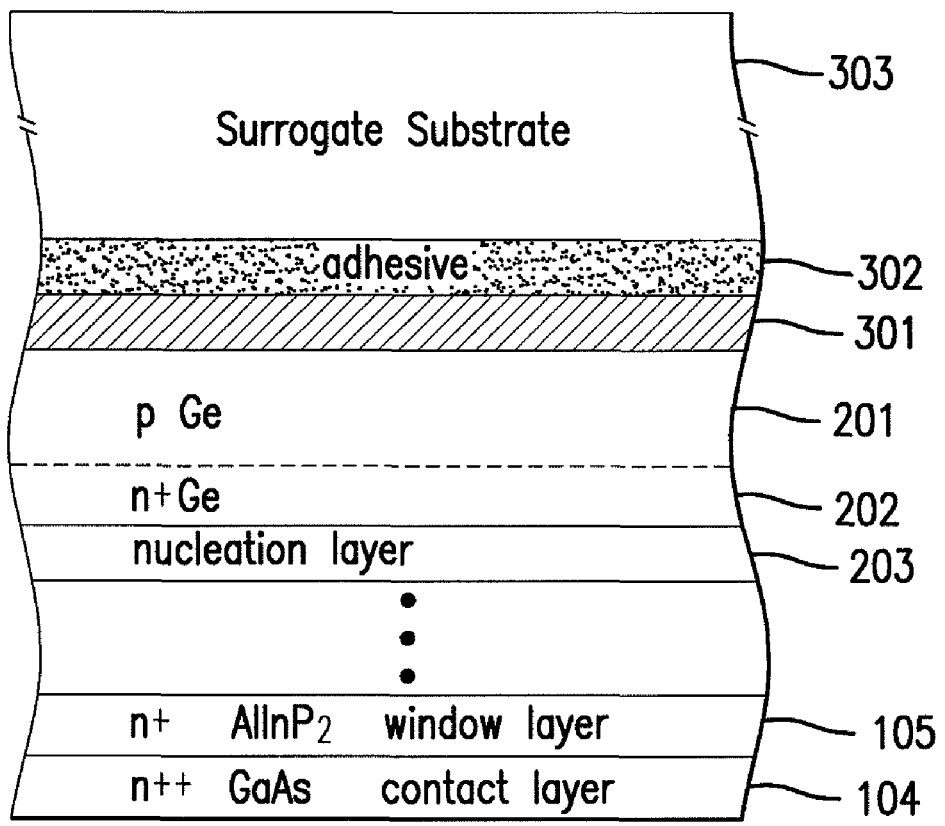
FIG. 11C is a cross-sectional view of the solar cell of FIG. 11B after the next process step in which the etch stop layer is removed.

FIG. 11C is a cross-sectional view of the solar cell of FIG. 11B after the next process step in which the etch stop layer 103 is removed preferably by a HCl/H$_2$O solution.

Figure 11D:
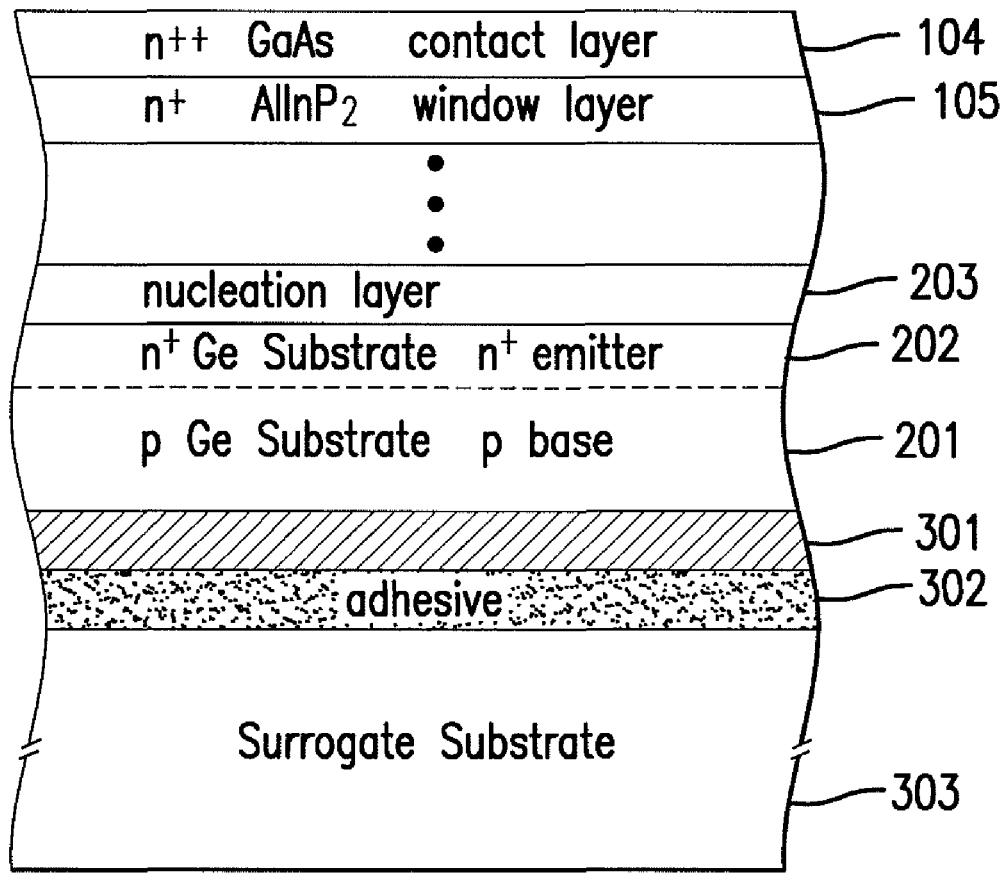
FIG. 11D is another cross-sectional view of the solar cell of FIG. 11B with an orientation depicting the surrogate substrate on the bottom of the Figure.

FIG. 11D is another cross-sectional view of the solar cell of FIG. 11C with an orientation depicting the surrogate on the bottom of the Figure. Subsequent Figures of this embodiment following in this application will assume such orientation.

Figure 12:
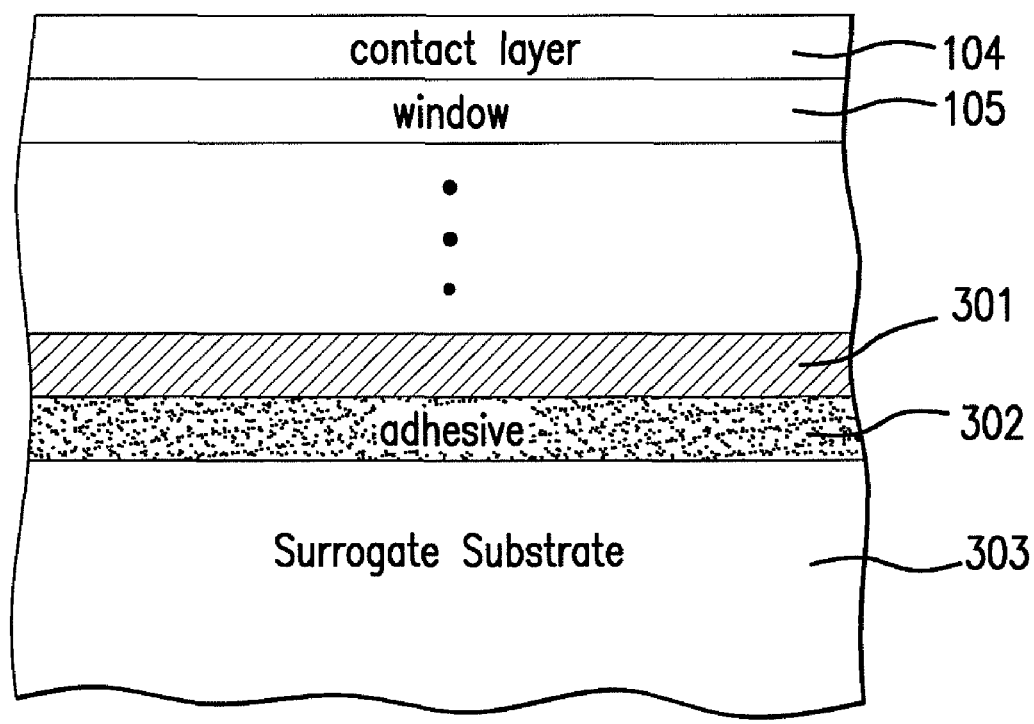
FIG. 12 is a highly simplified cross-sectional view of the solar cell of FIG. 11D.

FIG. 12 is a more highly simplified cross-sectional view of the solar cell of FIG. 11D.

Figure 13:
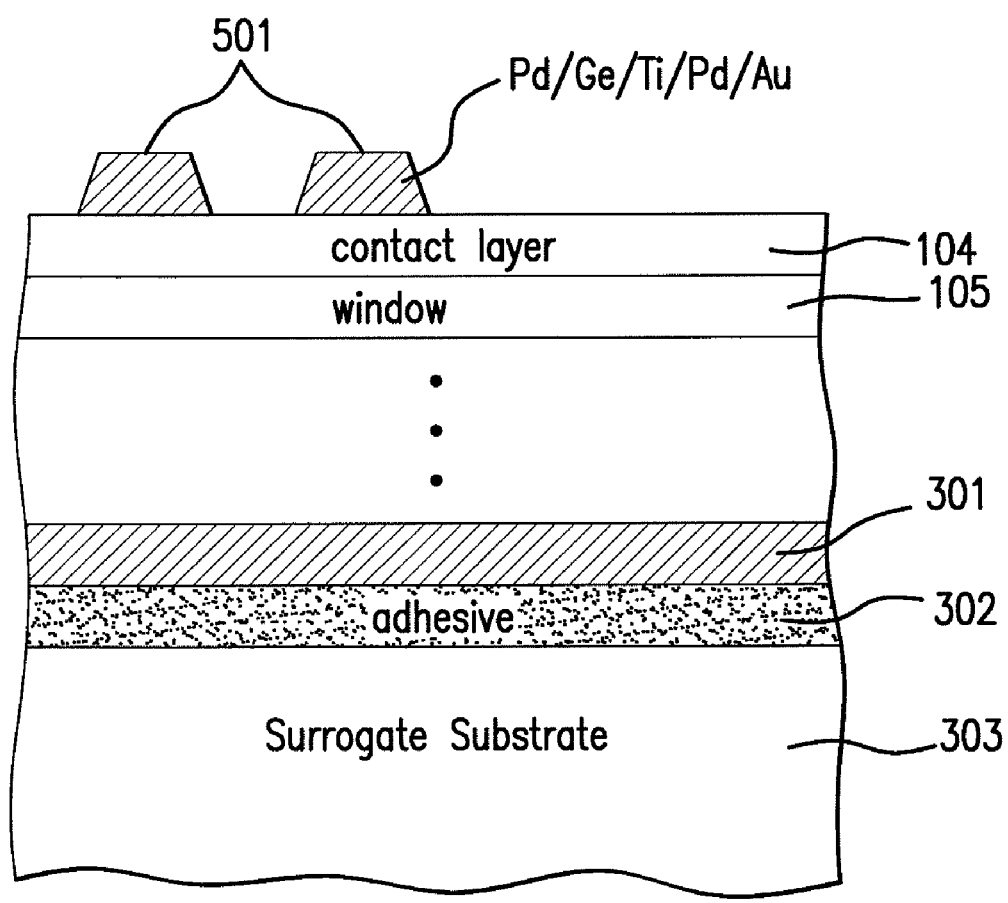
FIG. 13 is a cross-sectional view of the solar cell of FIG. 12 after the next process step in which the grid lines are formed over the contact layer.

FIG. 13 is a cross-sectional view of the solar cell of FIG. 12 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more particularly described in U.S. patent application Ser. No. 12/218,582, filed Jul. 18, 2008, the composition of the metal grid lines 501 is preferably the sequence of layers Pd/Ge/Ti/Pd/Au, although other suitable materials and sequence of layers may be used as well.

Figure 14:
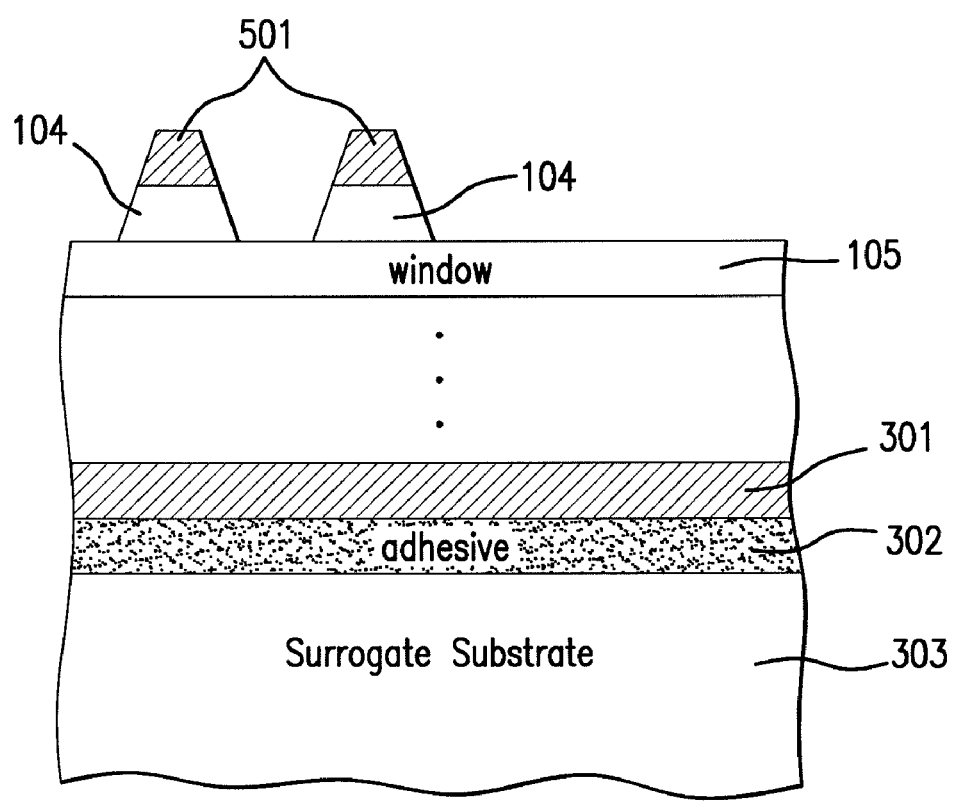
FIG. 14 is a cross-sectional view of the solar cell of FIG. 13 after the next process step.

FIG. 14 is a cross-sectional view of the solar cell of FIG. 13 after the next process step in which the grid lines are used as a mask to etch down the surface to the window layer 105 using a citric acid/peroxide etching mixture.

Figure 15:
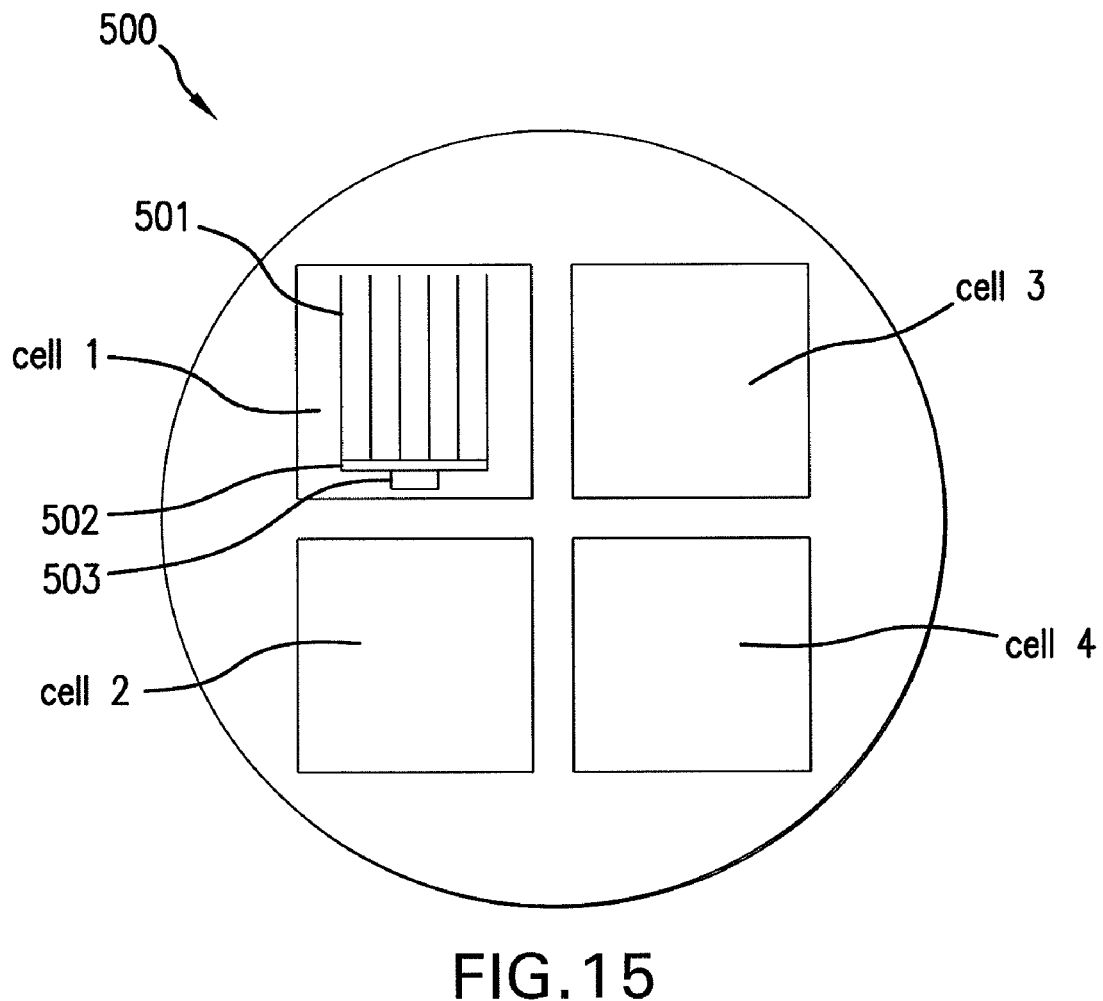
FIG. 15 is a top plan view of a wafer in which the solar cells are fabricated.

FIG. 15 is a top plan view of a wafer in which four solar cells are implemented. The depiction of four cells is for illustration for purposes only, and the present invention is not limited to any specific number of cells per wafer.

In each cell there are grid lines 501 (more particularly shown in cross-section in FIG. 14), an interconnecting bus line 502, and a contact pad 503. The geometry and number of grid and bus lines, is merely illustrative and the present invention is not limited to the illustrated embodiment.

Figure 16:
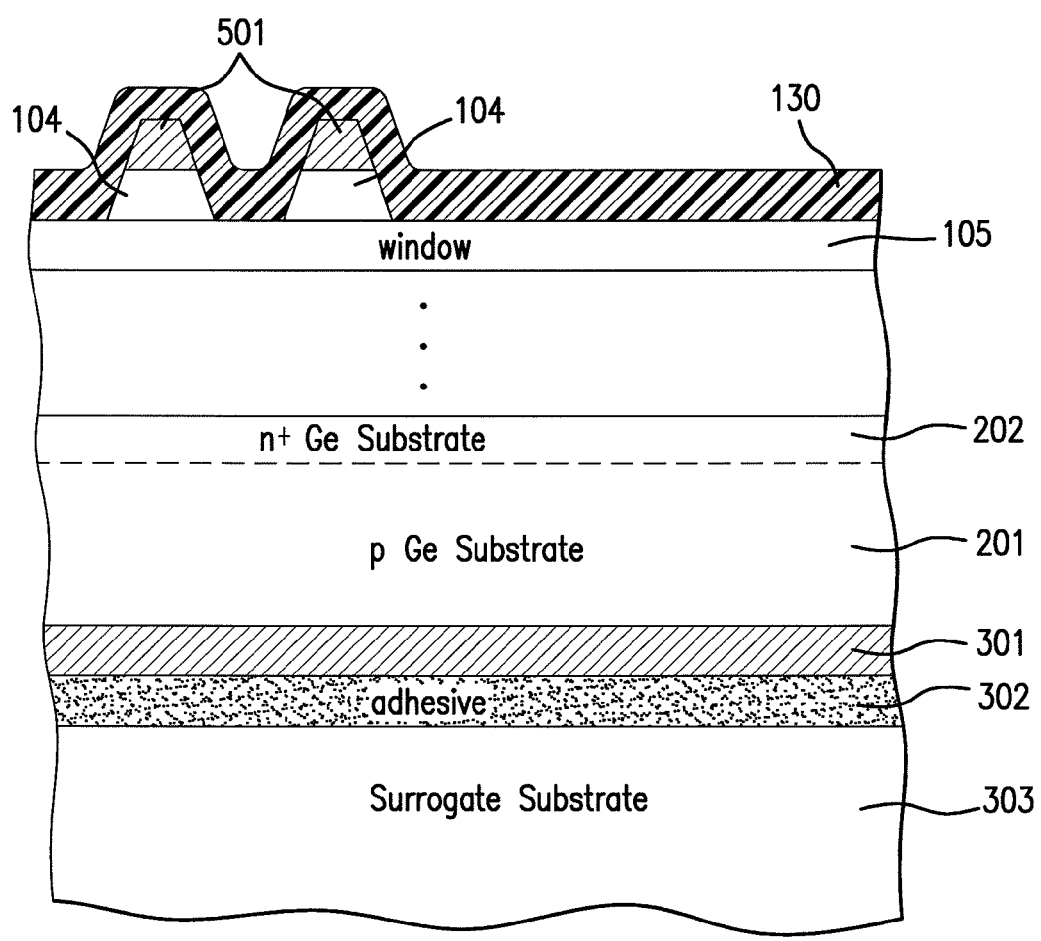
FIG. 16 is a cross-sectional view of the solar cell of FIG. 14 after the next process step.

FIG. 16 is a cross-sectional view of the solar cell of FIG. 14 after the next process step in which an antireflective (ARC) dielectric coating layer 130 is applied over the entire surface of the "bottom" side of the wafer with the grid lines 501.

Figure 17A:
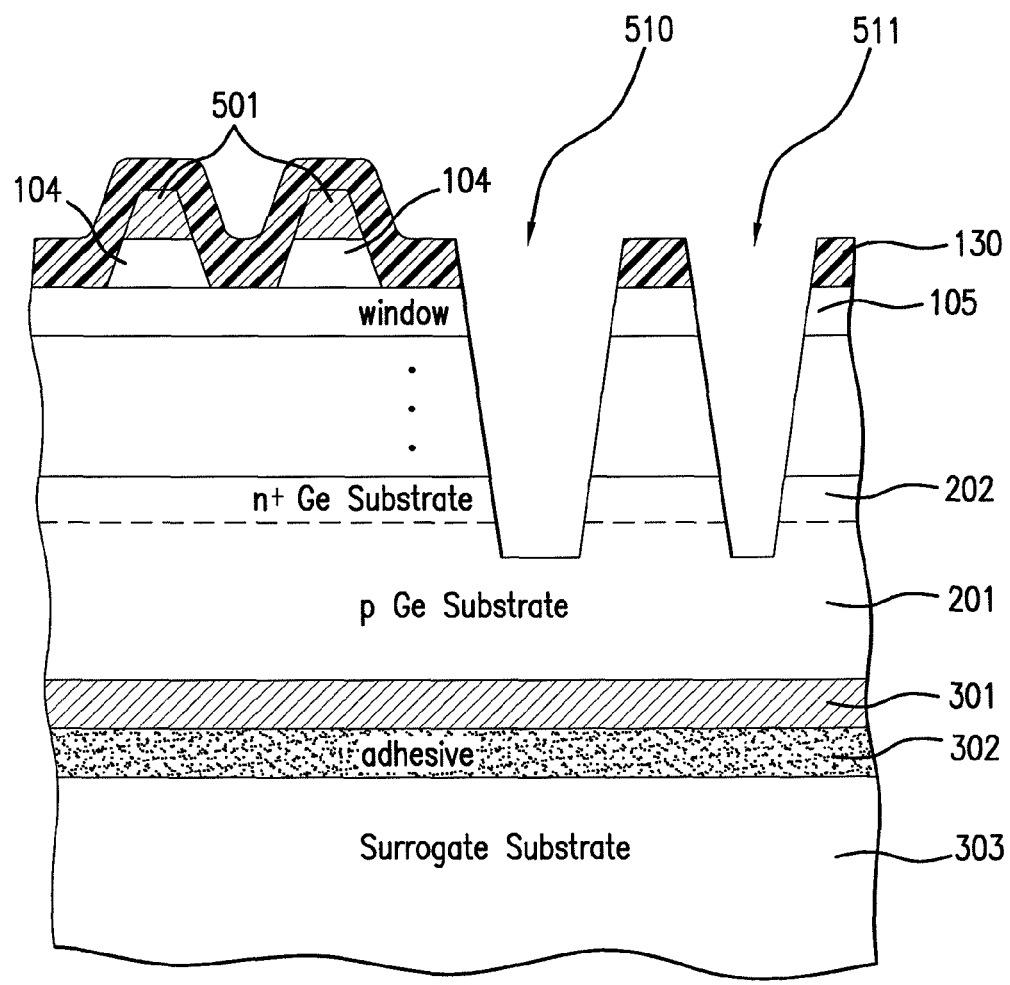
FIG. 17A is a cross-sectional view of the solar cell of FIG. 16 after the next process step.

FIG. 17A is a cross-sectional view of the solar cell of FIG. 16 after the next process step according to the present invention in which two channels 510 and 511, or portions of the semiconductor structure are etched down into the Ge substrate 201, preferably using phosphide and arsenide etchants, thereby defining a peripheral boundary and leaving a mesa structure which constitutes the solar cell. The cross-section depicted in FIG. 17A is that as seen from the A-A plane shown in FIG. 18.

Figure 17B:
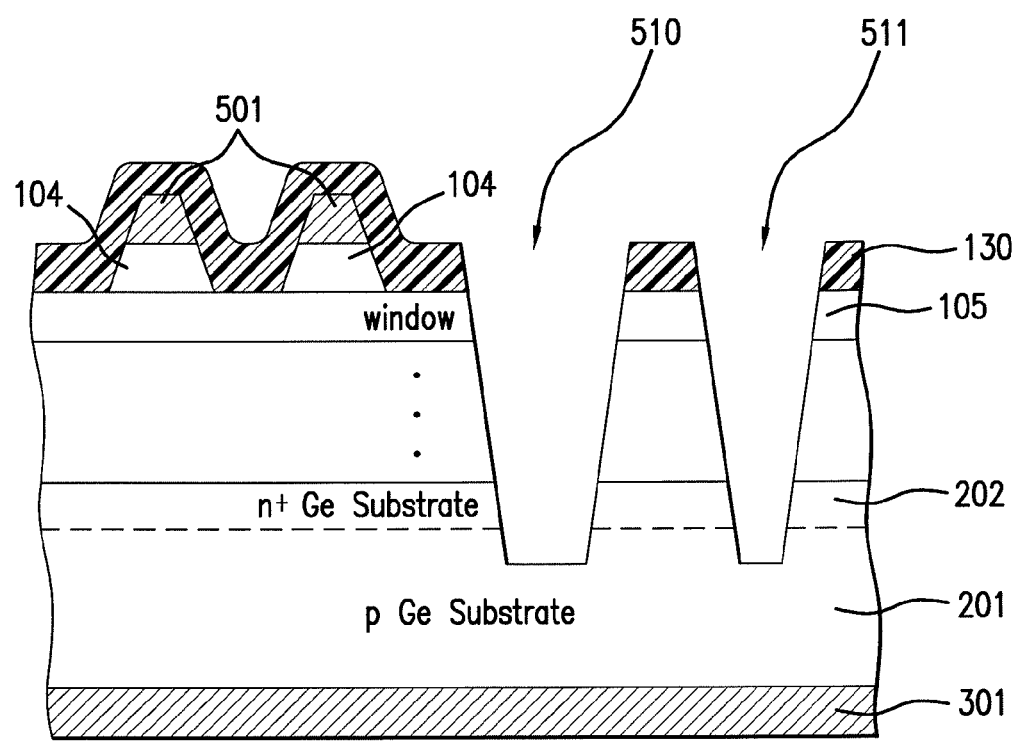
FIG. 17B is a cross-sectional view of the solar cell of FIG. 16 after the next process step in which the surrogate substrate is removed.

FIG. 17B is a cross-sectional view of the solar cell of FIG. 16 after the next process step in which the surrogate substrate 303 and adhesive 302 are removed, leaving only the metal contact layer 301 which forms the backside contact of each of the solar cells. The surrogate substrate is preferably removed by the use of the etchant EKC 922. The surrogate substrate includes perforations over its surface, preferably with a diameter is 0.033 inches and separated by 0.152 inches, that allow the flow of etchant through the surrogate substrate 303 to permit its lift off. After lift off, the surrogate substrate may be reused in subsequent wafer processing operations.

Figure 18:
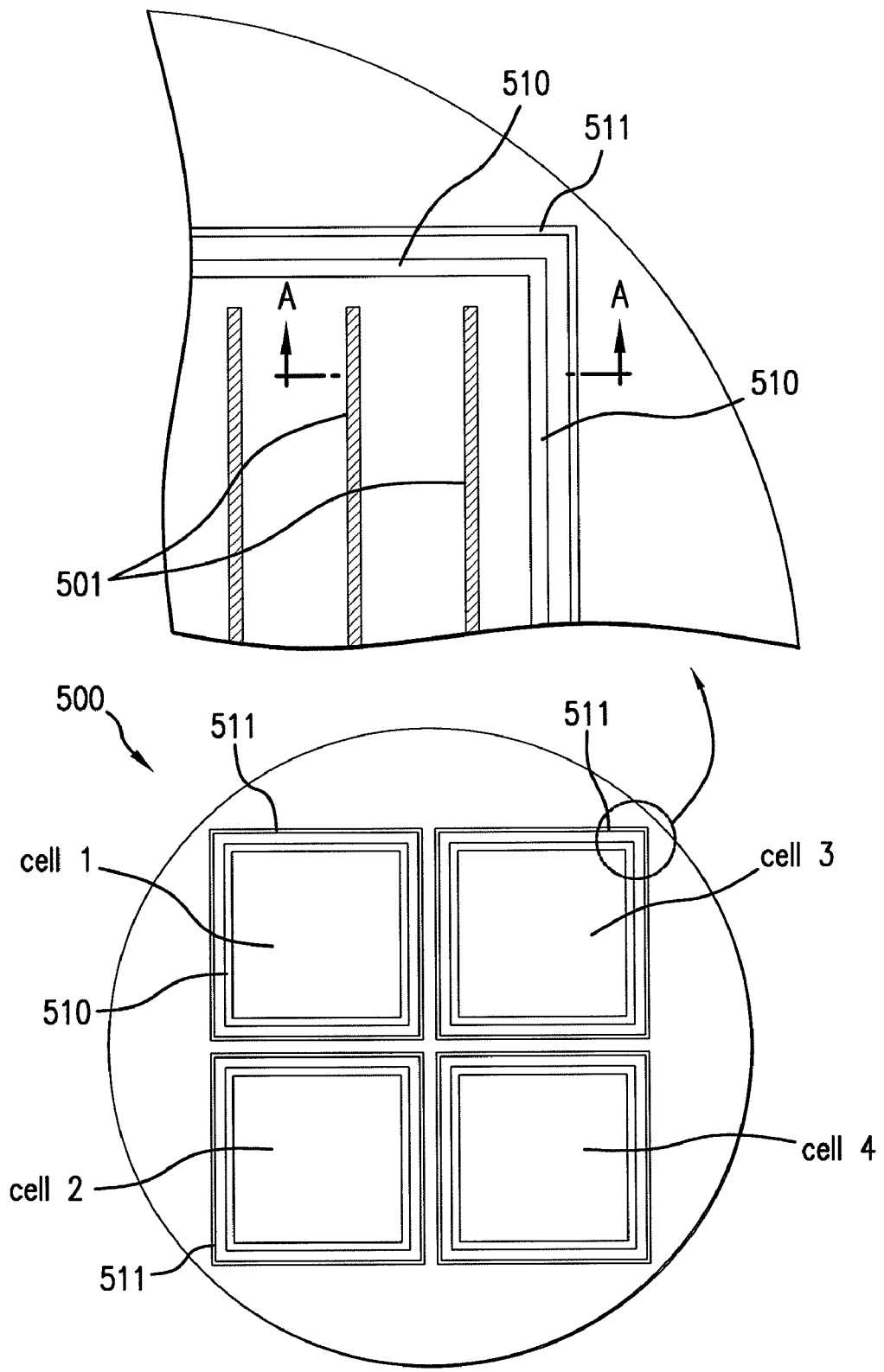
FIG. 18 is a top plan view of the wafer of FIG. 17 depicting the surface view of the trench etched around each of the solar cells.

FIG. 18 is a top plan view of the wafer of FIG. 15 depicting the channels 510 and 511 etched around the periphery of each cell using phosphide and arsenide etchants.

Figure 19:
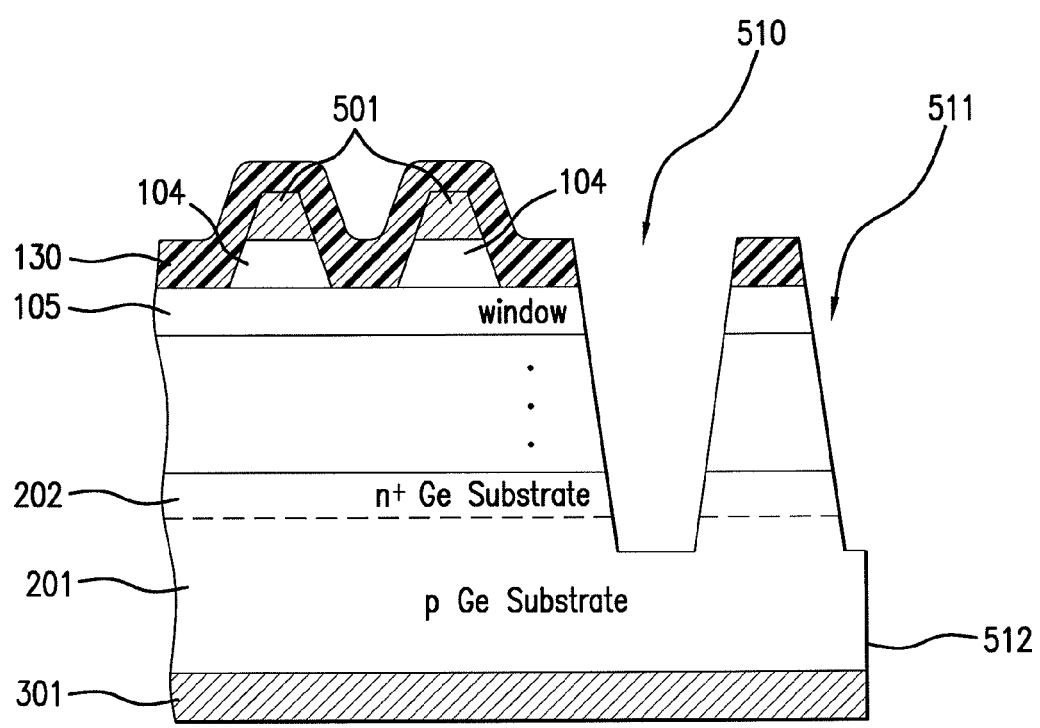
FIG. 19 is a cross-sectional view of the solar cell of FIG. 17B after the next process step in which the individual solar cells are scribed or diced from the wafer.

FIG. 19 is a cross-sectional view of the solar cell of FIG. 17B after the individual solar cells (cell 1, cell 2, etc. shown in FIG. 18) are cut or scribed from the wafer through the channel 511, leaving a vertical edge 512 extending through the Ge substrate 512 and the metal contact layer 301.

Figure 20:
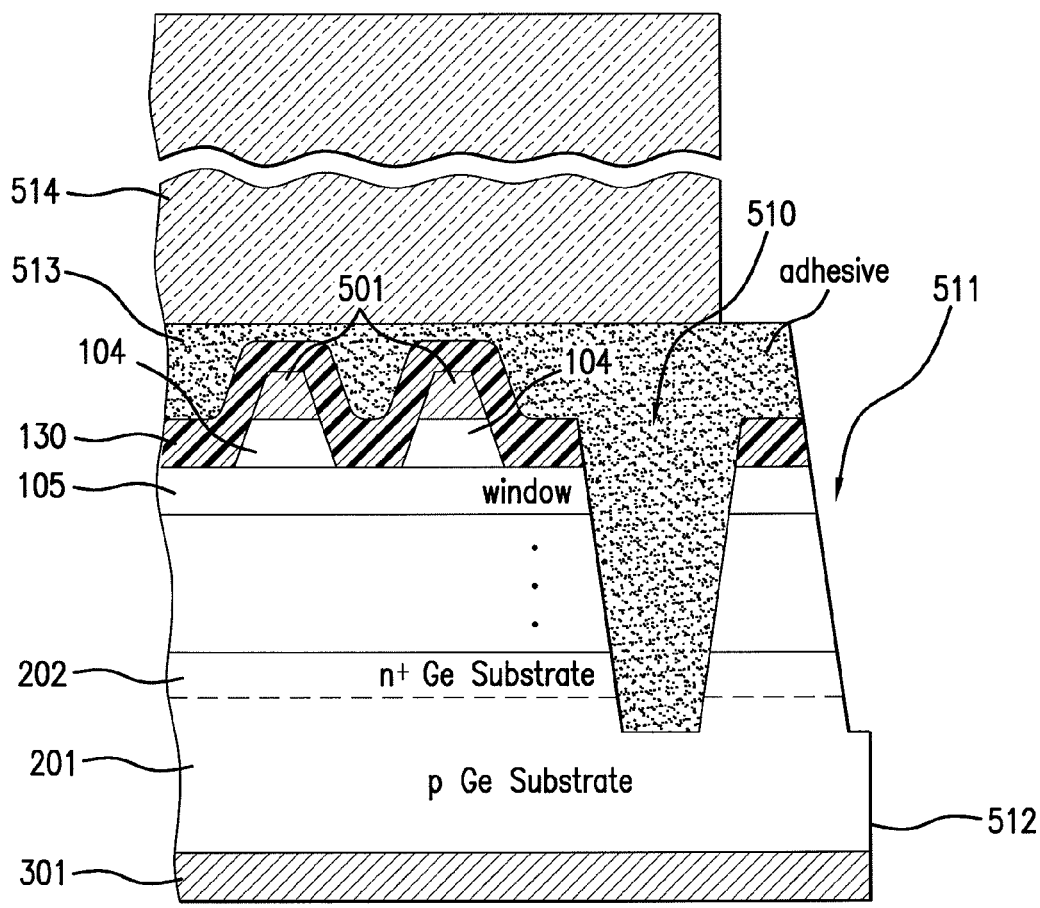
FIG. 20 is a cross-sectional view of the solar cell of FIG. 19 after the next process step in which a cover glass is attached to each cell.

FIG. 20 is a cross-sectional view of the solar cell of FIG. 19 after the next process step in an embodiment of the present invention in which a cover glass 514 is secured to the top of each of the individual cells by an adhesive 513.

Figure 21:
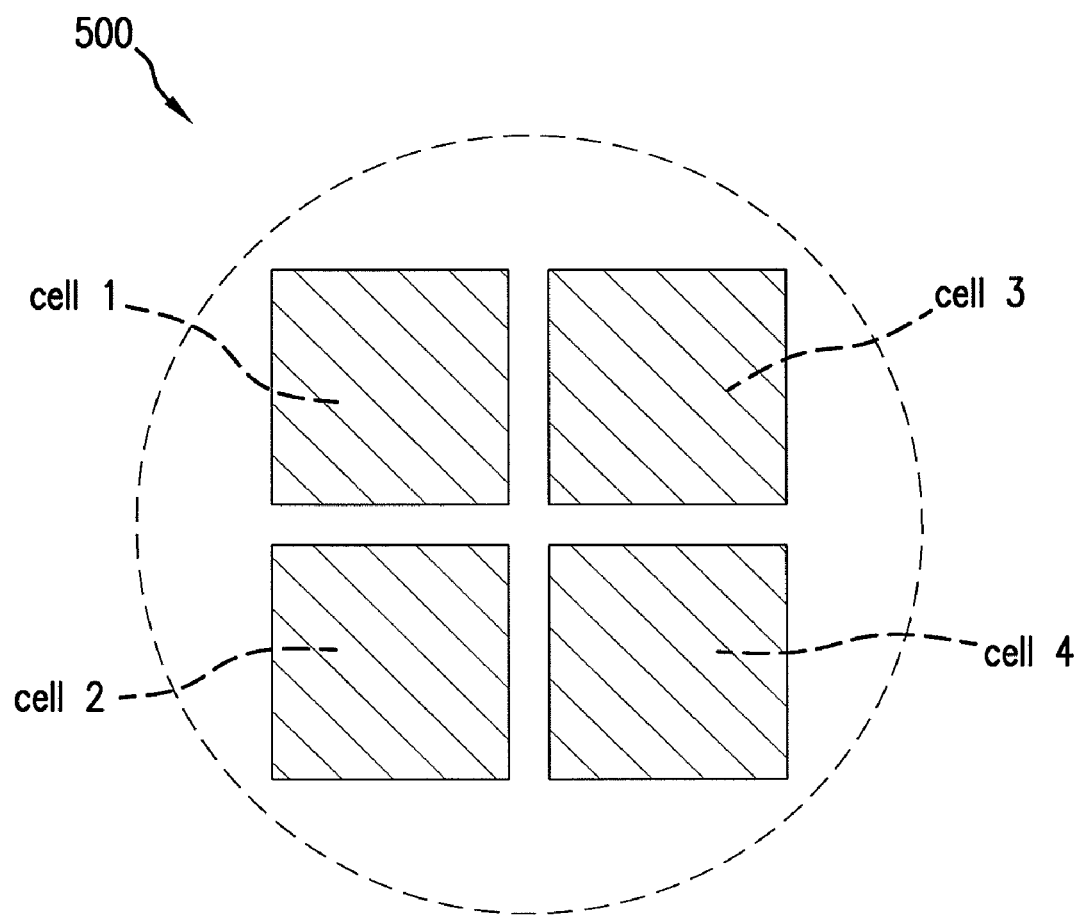
FIG. 21 is a bottom plan view of four cells cut from the wafer in which the solar cells are fabricated after the process step of FIG. 20.

FIG. 21 is a bottom plan view of the four individual solar cells shown in FIG. 18, now separated from the wafer (shown as an imaginary dotted line), showing the exposed backside metal contact layer 301.

Figure 22:
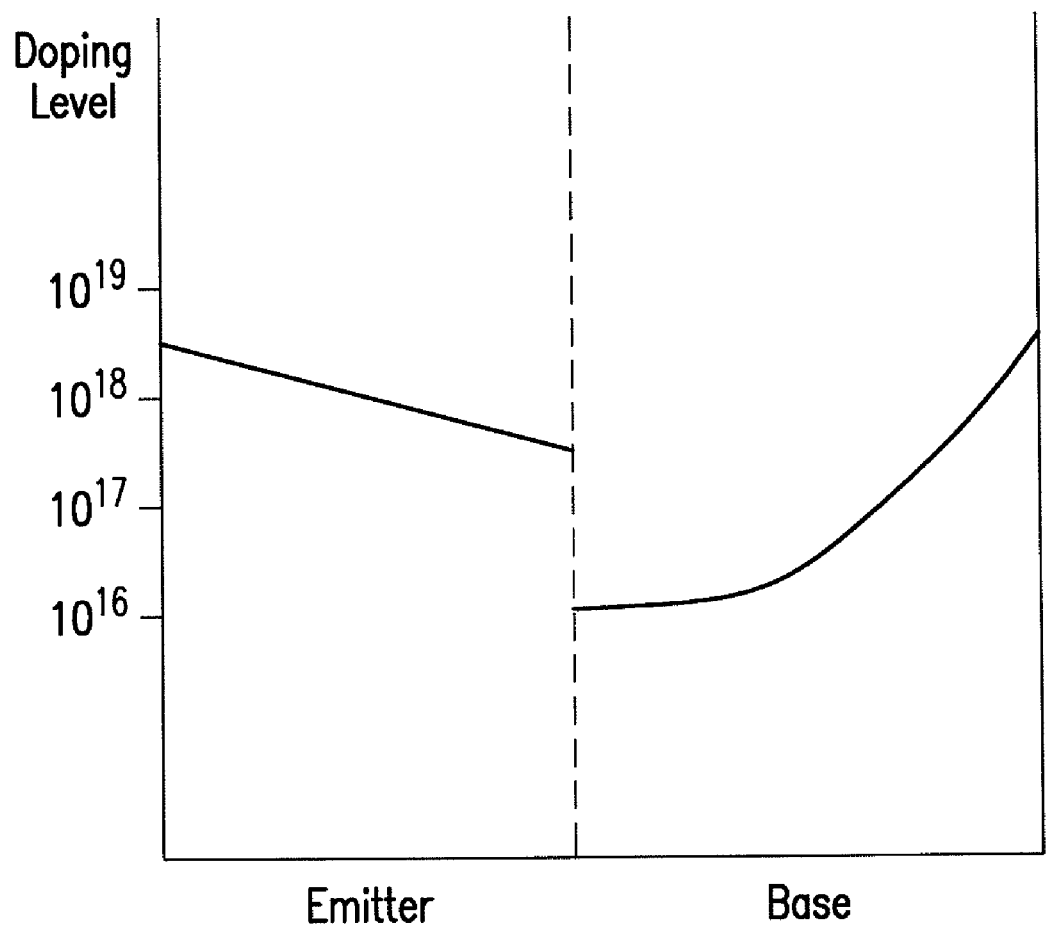
FIG. 22 is a graph of the doping profile in a base and adjoining emitter layer in the metamorphic solar cell according to the present invention.

FIG. 22 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

It will be understood that each of the elements described above, or two or more together, also may find a useful application in other types of constructions differing from the types of constructions described above.

Although the preferred embodiment of the present invention utilizes two semiconductor structures, one with a vertical stack of three subcells, and the other structure a single subcell based on a germanium substrate, the present invention can apply to stacks with fewer or greater number of subcells and substrates i.e. two junction cells, four junction cells, five junction cells, etc. as well as having more than two bonded semiconductor structures. In the case of four or more junction cells, the use of more than one metamorphic grading interlayer may also be utilized. The composition and individual band gaps of the subcells depicted in the present invention are merely illustrative, and those skilled in the art may be able to configure five, six or more subcells with different band gap ranges using the principles of the present invention.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter base layer. The intrinsic layer functions to suppress minority-carrier recombination in the space-charge region. Similarly, either the base layer or, the emitter layer may also be intrinsic or not-intentionally-doped ("ND") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other electronic and optoelectronic devices, such as, transistors, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:

1. A method of manufacturing a solar cell comprising:
   providing a first semiconductor substrate;
   depositing on the first semiconductor substrate a first sequence of layers of semiconductor material to form a first subassembly comprising an upper first solar subcell on said first semiconductor substrate, a middle second solar subcell over said upper first solar subcell, a graded interlayer over said middle second solar subcell, and a lower third solar subcell over said graded interlayer including a first lattice matched semiconductor layer disposed on a top surface of said first sequence of layers, wherein said first lattice matched semiconductor layer includes InGaAs;
   providing a second semiconductor substrate, wherein the second semiconductor substrate comprises germanium;
   depositing on a top surface of the second semiconductor substrate a second sequence of layers of semiconductor material forming a second subassembly comprising at least a third subcell including a second lattice matched semiconductor layer disposed on a top surface of said second sequence of layers;
   joining the first subassembly and the second subassembly by positioning the first lattice matched semiconductor layer of the first subassembly adjacent to the second lattice matched semiconductor layer of the second subassembly to form a bond joining the first and second assemblies, thus forming a multijunction device; and
   removing the first semiconductor substrate to expose an uppermost subcell of the multijunction device.

2. The method as defined in claim 1, wherein joining the first subassembly and the second subassembly takes place in an ultra high vacuum chamber.

3. The method as defined in claim 1, wherein said second sequence of layers includes layers forming a tunnel diode.

4. The method as defined in claim 3, wherein said layers forming a tunnel diode include InGaAs and AlGaAs layers.

5. The method as defined in claim 1, further comprising depositing a contact metal layer in a sequence of layers including Ti/Au/Ag/Au on a bottom surface of said second semiconductor substrate.

6. The method as defined in claim 1, wherein:
   said upper first solar subcell has a first band gap;
   said second solar subcell has a second band gap smaller than said first band gap;
   said graded interlayer has a third band gap; and
   said lower third solar subcell has a fourth band gap smaller than said second band gap such that said lower third solar subcell is lattice mismatched with respect to said middle second solar subcell.

7. The method as defined claim 1, wherein said second lattice matched semiconductor layer is composed of $In_{0.30}GaAs$.

8. The method as defined in claim 6, wherein the upper first solar subcell is composed of InGa(Al)P.

9. The method as defined in claim 6, wherein the middle second solar subcell comprises an emitter region and a base region, wherein the emitter region is composed of GaAs, GaInP, GaInAs, GaAsSb, or GaInAsN, and the base region is composed of GaAs, GaInAs, GaAsSb, or GaInAsN.

10. The method as defined in claim 6, wherein the lower third solar subcell comprises a base region and an emitter region, wherein the base region is composed of an InGaAs base layer, and the emitter region is composed of an InGaAs or an InGaP emitter layer.

11. The method as defined in claim 6, wherein the graded interlayer is compositionally graded to lattice match the middle second solar subcell on a first side and the lower third subcell on a second side.

12. The method as defined in claim 6, wherein the graded interlayer is composed of InGaAlAs.

13. The method as defined in claim 6, wherein the graded interlayer has a thickness and has approximately a 1.5 eV band gap throughout the thickness of said graded interlayer.

14. A method of manufacturing a solar cell comprising:
   providing a first semiconductor substrate;
   depositing on the first semiconductor substrate a first sequence of layers of semiconductor material forming a first subassembly comprising at least a first subcell and a second subcell including a first lattice matched InGaAs semiconductor layer on a top surface of said first sequence of layers;

providing a second semiconductor substrate;

depositing on the second semiconductor substrate a second sequence of layers of semiconductor material foaming a second subassembly comprising at least a third subcell including a second lattice matched InGaAs semiconductor layer disposed on a top surface of said second sequence of layers;

positioning the first lattice matched InGaAs semiconductor layer of the first subassembly adjacent the second lattice matched InGaAs semiconductor layer of the second subassembly, and bonding the first sequence of layers to the second sequence of layers to join the first and second subassemblies and form a multijunction device;

mounting a surrogate third substrate on top of the second semiconductor substrate; and removing the first semiconductor substrate from the multijunction device to expose an uppermost subcell of the device and form a bonded semiconductor structure.

15. The method as defined in claim 14, wherein said first semiconductor substrate is GaAs, and said second semiconductor substrate is germanium, and said bonding takes place in ultra high vacuum at approximately 400° C.

16. The method as defined in claim 14, wherein said second sequence of layers includes layers forming a tunnel diode including InGaAs and AlGaAs layers.

17. The method as defined in claim 14, wherein said first lattice matched InGaAs semiconductor layer is composed of $In_{0.30}GaAs$, and said second lattice matched InGaAs semiconductor layer is composed of $In_{0.015}GaAs$.

18. The method as defined in claim 14, further comprising depositing a contact metal layer consisting essentially of a sequence of layers including Ti/Au/Ag/Au on a bottom surface of said second semiconductor substrate.

19. The method as defined in claim 14, wherein the surrogate third substrate is selected from the group of sapphire, Ge, GaAs, and silicon.

20. The method as defined in claim 14, wherein the second sequence of layers of the second semiconductor substrate is bonded to said surrogate third substrate by an adhesive.

21. The method as defined in claim 14, further comprising mounting the bonded semiconductor structure on a rigid coverglass, and removing the surrogate third substrate.

22. A method of manufacturing a solar cell comprising:

providing a first GaAs semiconductor substrate;

depositing on the first semiconductor substrate a first sequence of layers of semiconductor material to form a first subassembly including at least a first solar subcell and a first lattice matched InGaAs semiconductor layer disposed on a top surface of said first sequence of layers;

providing a second Ge semiconductor substrate;

depositing on a top surface of the second Ge semiconductor substrate a second sequence of layers of semiconductor material forming a second subassembly including at least a second solar subcell and a second lattice matched InGaAs semiconductor layer disposed on a top surface of said second sequence of layers;

joining the first subassembly and the second subassembly by juxtaposing the first lattice matched InGaAs semiconductor layer of the first subassembly adjacent to the second lattice matched InGaAs semiconductor layer of the second subassembly in ultra high vacuum at approximately 400° C. to form a bond joining the first and second subassemblies, thus forming a device;

mounting a surrogate third substrate on the second semiconductor substrate; and removing the first GaAs semiconductor substrate from the device to expose an uppermost subcell of the device and form a bonded semiconductor structure.

* * * * *